(12) United States Patent
Ikeda et al.

(10) Patent No.: US 12,389,650 B2
(45) Date of Patent: Aug. 12, 2025

(54) SEMICONDUCTOR DEVICE AND ELECTRONIC DEVICE

(71) Applicant: Semiconductor Energy Laboratory Co., Ltd., Atsugi (JP)

(72) Inventors: Takayuki Ikeda, Atsugi (JP); Hitoshi Kunitake, Isehara (JP); Hajime Kimura, Atsugi (JP); Haruyuki Baba, Isehara (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 825 days.

(21) Appl. No.: 17/611,933

(22) PCT Filed: May 11, 2020

(86) PCT No.: PCT/IB2020/054412
§ 371 (c)(1),
(2) Date: Nov. 17, 2021

(87) PCT Pub. No.: WO2020/240311
PCT Pub. Date: Dec. 3, 2020

(65) Prior Publication Data
US 2022/0231131 A1     Jul. 21, 2022

(30) Foreign Application Priority Data

May 24, 2019 (JP) .................. 2019-097502
May 30, 2019 (JP) .................. 2019-100889
(Continued)

(51) Int. Cl.
*H03F 1/22*     (2006.01)
*H01L 23/66*    (2006.01)
(Continued)

(52) U.S. Cl.
CPC ............. *H10D 62/80* (2025.01); *H01L 23/66* (2013.01); *H03F 3/193* (2013.01); *H10D 84/01* (2025.01);
(Continued)

(58) Field of Classification Search
CPC ........................................ H03F 1/22
(Continued)

(56) References Cited

U.S. PATENT DOCUMENTS 6,366,172 B1 * 4/2002 Hayashi ................. H03F 1/223
330/253
6,639,446 B2    10/2003 Komurasaki et al.
(Continued)

FOREIGN PATENT DOCUMENTS

EP     1096669 A       5/2001
JP     2003-078355 A   3/2003
(Continued)

OTHER PUBLICATIONS

International Search Report (Application No. PCT/IB2020/054412) Dated Aug. 11, 2020.
(Continued)

*Primary Examiner* — Henry Choe
(74) *Attorney, Agent, or Firm* — Eric J. Robinson; Robinson Intellectual Property Law Office, P.C.

(57) ABSTRACT

A semiconductor device with low power consumption is provided. In a cascode circuit including a first transistor provided on a low power supply potential side and a second transistor provided on a high power supply potential side, a source or a drain of a third transistor and a capacitor are connected to a gate of the second transistor. A gate of the first transistor is electrically connected to a back gate of the second transistor. An OS transistor is used as the third transistor.

20 Claims, 31 Drawing Sheets

(30) Foreign Application Priority Data

May 31, 2019 (JP) .................................. 2019-102131
Jun. 21, 2019 (JP) .................................. 2019-115159

(51) Int. Cl.
  *H03F 3/193* (2006.01)
  *H10D 62/80* (2025.01)
  *H10D 84/01* (2025.01)
  *H10D 84/80* (2025.01)

(52) U.S. Cl.
  CPC .... *H10D 84/811* (2025.01); *H01L 2223/6677* (2013.01)

(58) Field of Classification Search
  USPC .................................................. 330/310, 311
  See application file for complete search history.

(56) References Cited

U.S. PATENT DOCUMENTS

| | | | |
|---|---|---|---|
| 8,638,162 | B2 | 1/2014 | Watanabe |
| 8,824,193 | B2 | 9/2014 | Yoneda |
| 9,343,288 | B2 | 5/2016 | Koyama et al. |
| 9,412,762 | B2 | 8/2016 | Koyama et al. |
| 9,590,594 | B2 | 3/2017 | Kozuma |
| 10,008,929 | B2 | 6/2018 | Koyama et al. |
| 10,050,015 | B2 | 8/2018 | Pillarisetty et al. |
| 2012/0075007 | A1 | 3/2012 | Watanabe |
| 2012/0294066 | A1 | 11/2012 | Yoneda |
| 2015/0200605 | A1* | 7/2015 | Weis .............. H03K 17/102 363/127 |
| 2015/0256157 | A1 | 9/2015 | Kozuma |
| 2017/0069596 | A1 | 3/2017 | Pillarisetty et al. |
| 2022/0231644 | A1 | 7/2022 | Ito et al. |
| 2022/0255511 | A1 | 8/2022 | Kimura et al. |
| 2022/0255579 | A1 | 8/2022 | Ikeda et al. |

FOREIGN PATENT DOCUMENTS

| | | |
|---|---|---|
| JP | 2015-046592 A | 3/2015 |
| JP | 2015-047061 A | 3/2015 |
| JP | 2015-188209 A | 10/2015 |
| JP | 2017-510979 | 4/2017 |
| KR | 2015-0104518 A | 9/2015 |
| KR | 2017-0095638 A | 8/2017 |
| TW | 201547200 | 12/2015 |
| WO | WO-2000/002307 | 1/2000 |

OTHER PUBLICATIONS

Written Opinion (Application No. PCT/IB2020/054412) Dated Aug. 11, 2020.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

* cited by examiner

FIG. 23A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 23B
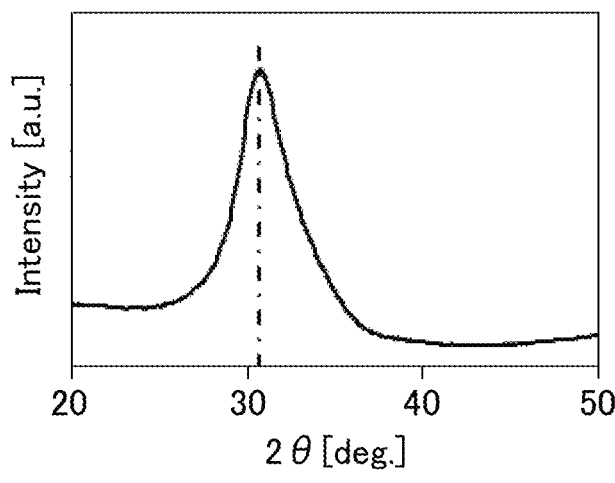
FIG. 23C
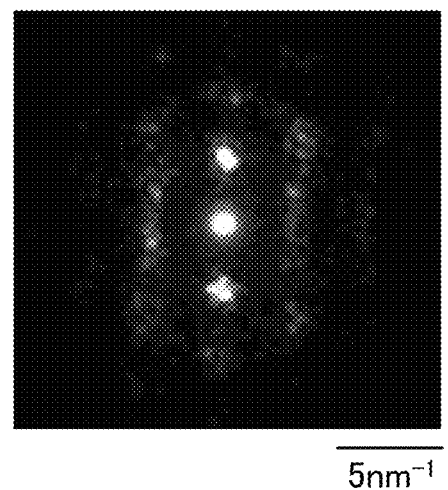

SEMICONDUCTOR DEVICE AND ELECTRONIC DEVICE

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a circuit including a semiconductor element are semiconductor devices.

A display device, a light-emitting device, a lighting device, an electro-optical device, a communication device, an electronic device, and the like may include a semiconductor element or a semiconductor circuit. Therefore, a display device, a light-emitting device, a lighting device, an electro-optical device, an imaging device, a communication device, an electronic device, and the like are referred to as a semiconductor device in some cases.

BACKGROUND ART

Information terminals that are easy to carry, typified by smartphones, tablet terminals, and the like, have come into widespread use. With the widespread use of information terminals, various communication standards have been established. For example, the use of an LTE-Advanced standard called the fourth-generation mobile communication system (4G) has started.

With the development of information technology such as IoT (Internet of Things), the amount of data handled in information terminals has been recently showing an increasing tendency. In addition, the communication speed of electronic devices such as information terminals needs to be improved.

A base station needs to be connected to approximately one million information terminals per 1 km$^2$ simultaneously in order to achieve IoT. However, the number of feasible simultaneous connections with information terminals at 4G is approximately 20,000 per 1 km$^2$.

In order to be compatible with various kinds of information technology such as IoT, a new communication standard called the fifth-generation mobile communication system (5G) that achieves higher transmission speed, more simultaneous connections, and shorter delay time than 4G has been examined. Note that 5G uses communication frequencies of a 3.7 GHz band, a 4.5 GHz band, and a 28 GHz band.

A 5G compatible semiconductor device is manufactured using a semiconductor containing one kind of element such as Si as its main component or a compound semiconductor containing a plurality of kinds of elements such as Ga and As as its main components. Furthermore, an oxide semiconductor, which is one kind of metal oxide, has attracted attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

Improvement of communication speed tends to increase power consumption. Thus, electronic devices such as information terminals need to improve communication speed and reduce power consumption.

An object of one embodiment of the present invention is to provide a semiconductor device or the like with reduced power consumption. Another object is to provide a semiconductor device or the like that stably operates. Another object is to provide a semiconductor device or the like with high reliability. Another object is to provide a semiconductor device or the like with high productivity. Another object is to provide a novel semiconductor device or the like.

Note that the description of these objects does not preclude the existence of other objects. In one embodiment of the present invention, there is no need to achieve all the objects. Note that objects other than these will be apparent from the description of the specification, the drawings, the claims, and the like, and objects other than these can be derived from the description of the specification, the drawings, the claims, and the like.

Means for Solving the Problems

In a semiconductor device including a cascode circuit including a first transistor provided on a low power supply potential side and a second transistor provided on a high power supply potential side, a source or a drain of a third transistor and a capacitor are connected to a gate of the second transistor. An OS transistor is used as the third transistor.

One embodiment of the present invention is a semiconductor device including a first transistor, a second transistor, a third transistor, a capacitor, and a functional element. One of a source and a drain of the first transistor is electrically connected to a first terminal. The other of the source and the drain of the first transistor is electrically connected to one of a source and a drain of the second transistor. A gate of the first transistor is electrically connected to a second terminal. The other of the source and the drain of the second transistor is electrically connected to a third terminal. The other of the source and the drain of the second transistor is electrically connected to the functional element. One of a source and a drain of the third transistor is electrically connected to a fourth terminal. The other of the source and the drain of the third transistor is electrically connected to the gate of the second transistor. A gate of the third transistor is electrically connected to a fifth terminal. The other of the source and the drain of the third transistor is provided with the capacitor. A semiconductor layer of the third transistor includes an oxide semiconductor.

The second transistor may include a back gate. The gate of the first transistor may be electrically connected to the back gate of the second transistor.

The functional element is preferably a resistor, a constant current source, or a parallel resonant circuit. The oxide semiconductor preferably contains at least one of In and Zn.

At least one of the first to the third transistors may be a multi-gate transistor. A semiconductor layer of the second transistor may include an oxide semiconductor. A semiconductor layer of the third transistor may include an oxide semiconductor.

The semiconductor device may be electrically connected to an antenna.

Another embodiment of the present invention is an electronic device including the semiconductor device described above and a speaker, a microphone, or a secondary battery.

Another embodiment of the present invention is a semiconductor device including a first layer, a second layer, and a third layer. The first layer includes a transmission/reception device and a signal processing device. The second layer includes a memory device. The third layer includes an antenna array. The transmission/reception device includes a fourth transistor. The signal processing device includes a fifth transistor. The memory device includes a memory element. The memory element includes a sixth transistor and a capacitor. The sixth transistor includes an oxide semiconductor in a semiconductor layer. The antenna array includes a plurality of antennas. The first layer and the third layer include regions overlapping with each other with the second layer therebetween.

An LDMOS-FET may be used as the fourth transistor. A MOS-FET may be used as the fifth transistor.

The oxide semiconductor preferably contains at least one of In and Zn.

The signal processing device may include a demodulator and a modulator. The semiconductor device may have a function of transmitting a radio wave with beamforming. The semiconductor device may have a function of transmitting a radio wave with spatial multiplex transmission. The semiconductor device may have a function of receiving a radio wave with spatial multiplex transmission.

Effect of the Invention

According to one embodiment of the present invention, a semiconductor device or the like with reduced power consumption can be provided. A semiconductor device or the like which stably operates can be provided. A semiconductor device or the like with high reliability can be provided. A semiconductor device or the like with high productivity can be provided. A novel semiconductor device or the like can be provided.

Note that the description of these effects does not preclude the existence of other effects. One embodiment of the present invention does not have to have all these effects. Note that effects other than these are apparent from the description of the specification, the drawings, the claims, and the like, and effects other than these can be derived from the description of the specification, the drawings, the claims, and the like.

BRIEF DESCRIPTION OF THE DRAWINGS

FIG. 23A is a diagram showing the classification of crystal structures of IGZO. FIG. 23B is a graph showing an XRD spectrum of a CAAC-IGZO film. FIG. 23C is an image showing nanobeam electron diffraction patterns of a CAAC-IGZO film.

MODE FOR CARRYING OUT THE INVENTION

Figure 1A:
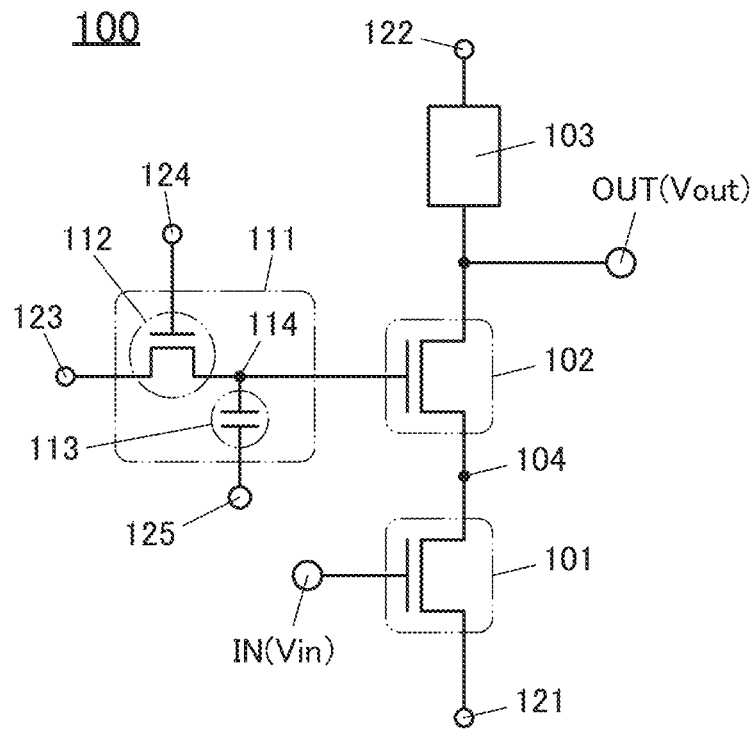
FIG. 1A is a circuit diagram of a semiconductor device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

In addition, the position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in drawings and the like. For example, in an actual manufacturing process, a resist mask or the like might be unintentionally reduced in size by treatment such as etching, which might not be reflected in the drawings for easy understanding.

Furthermore, in a top view (also referred to as a "plan view"), a perspective view, or the like, the description of some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs a current, inputs or outputs a voltage, or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

In addition, functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit.

Furthermore, in this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

In addition, a voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS", "L potential", or "L"). The potential VSS refers to a power supply potential at a potential lower than the potential VDD. A ground potential (hereinafter, also simply referred to as "GND" or "GND potential") can be used as VDD or VSS. For example, in the case where VDD is a ground potential, VSS is a potential lower than the ground potential, and in the case where VSS is a ground potential, VDD is a potential higher than the ground potential.

In addition, in this specification and the like, a gate refers to part or the whole of a gate electrode and a gate wiring. A gate wiring refers to a wiring for electrically connecting at least one gate electrode of a transistor to another electrode or another wiring.

Furthermore, in this specification and the like, a source refers to part or the whole of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or the whole of a drain region, a drain electrode, or a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

Figure 10A:
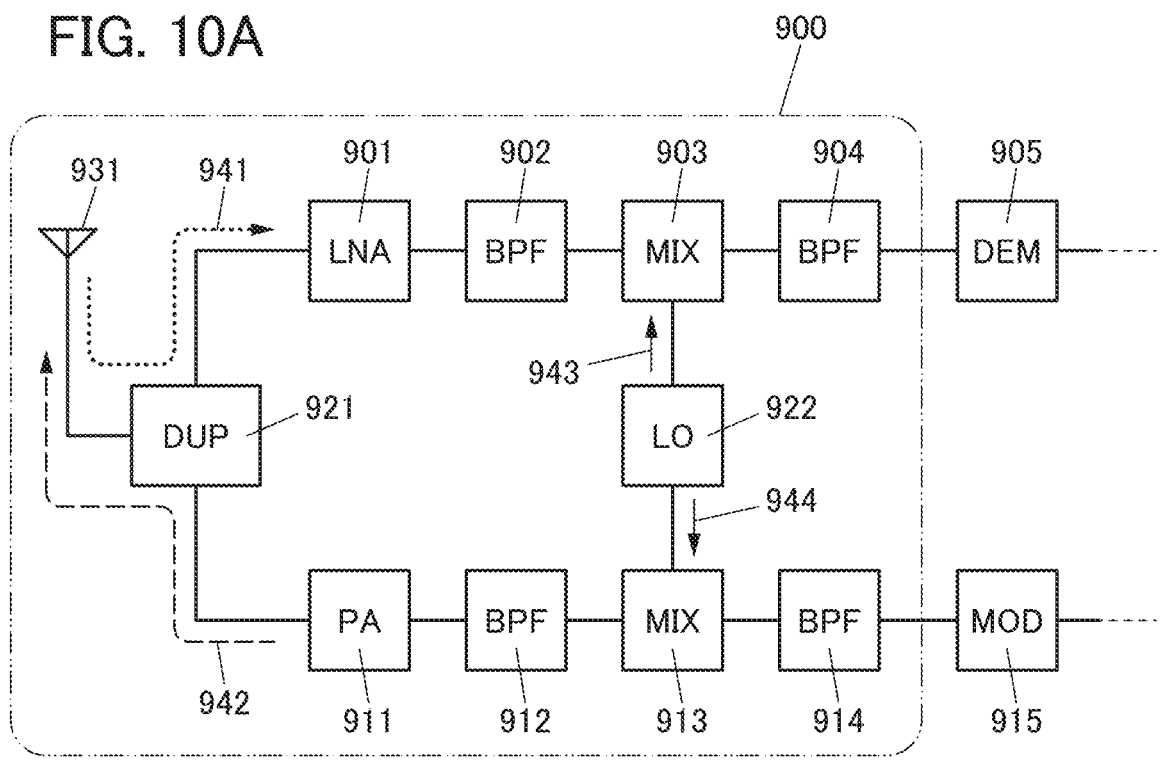
FIG. 10A is a diagram illustrating a structure example of a wireless transceiver.

A semiconductor device of one embodiment of the present invention is described with reference to drawings. FIG. 10A is a block diagram illustrating a structure of a wireless transceiver 900 that is a type of semiconductor device.

Note that the structure of the semiconductor device described in this specification and the like is just an example, and all of the components are not necessarily included. It is acceptable as long as the semiconductor device includes necessary components among the components described in this specification and the like. A component other than the components described in this specification and the like may be included.

The wireless transceiver 900 includes a low noise amplifier 901 (LNA), a band pass filter 902 (BPF), a mixer 903 (MIX), a band pass filter 904, a power amplifier 911 (PA), a band pass filter 912, a mixer 913, a band pass filter 914, a duplexer 921 (DUP), a local oscillator 922 (LO), and an antenna 931.

<Reception>

A signal 941 transmitted from another semiconductor device, a base station, or the like is input to the low noise amplifier 901 through the antenna 931 and the duplexer 921 as a received signal. The duplexer 921 has a function of transmitting and receiving a radio signal with one antenna.

The low noise amplifier 901 has a function of amplifying a weak received signal to a signal with strength that can be processed in the wireless transceiver 900. The signal 941 amplified by the low noise amplifier 901 is supplied to the mixer 903 through the band pass filter 902.

The band pass filter 902 has a function of attenuating frequency components other than frequency components in a necessary frequency band among frequency components contained in the signal 941 to allow the necessary frequency components in the necessary frequency band to pass through.

The mixer 903 has a function of mixing the signal 941 passed through the band pass filter 902 and a signal 943 generated in the local oscillator 922 by a superheterodyne system. The mixer 903 mixes the signal 941 and the signal 943, and supplies a signal that has a frequency component of the difference therebetween and a frequency component of the sum thereof, to the band pass filter 904. Note that instead of a superheterodyne system, a homodyne system may be used.

The band pass filter 904 has a function of passing one frequency of two frequency components. For example, a frequency component of the difference is passed. The band pass filter 904 also has a function of removing a noise component generated in the mixer 903. The signal passed through the band pass filter 904 is supplied to a demodulator 905 (DEM). The demodulator 905 has a function of converting the supplied signal into a control signal, a data signal, or the like and outputting the signal. The signal output from the demodulator 905 is supplied to a variety of processing devices (e.g., an arithmetic device or a memory device).

<Transmission>

A basic signal is supplied from a modulator 915 (MOD) to the band pass filter 914. The modulator 915 has a function of generating a basic signal for transmitting a control signal, a data signal, or the like from the wireless transceiver 900 to another semiconductor device, a base station, or the like. The basic signal is supplied to the mixer 913 through the band pass filter 914.

The band pass filter 914 has a function of removing a noise component contained in the basic signal.

The mixer 913 has a function of mixing the basic signal passed through the band pass filter 914 and a signal 944 generated in the local oscillator 922 by a superheterodyne system. The mixer 913 mixes the basic signal and the signal 944, and a signal having a frequency component of the difference therebetween and a frequency component of the sum thereof is supplied to the band pass filter 912.

The band pass filter 912 has a function of passing one frequency of two frequency components. For example, a frequency component of the sum is passed. The band pass filter 912 also has a function of removing a noise component generated in the mixer 913. The signal passed through the band pass filter 912 is supplied to the power amplifier 911.

The power amplifier 911 has a function of amplifying the supplied signal to generate a signal 942. The signal 942 is emitted from the antenna 931 to the outside through the duplexer 921.

[Demodulator]

Figure 10B:
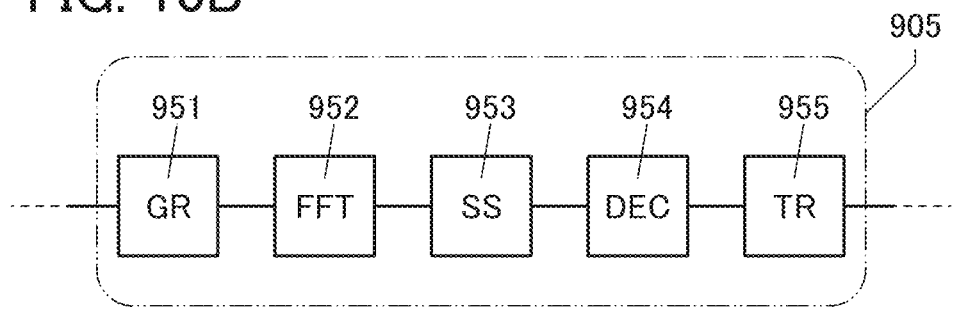
FIG. 10B is a diagram illustrating a structure example of a demodulator.

FIG. 10B illustrates a structure example of the demodulator 905 illustrated in FIG. 10B. The demodulator 905 includes a guard interval removing circuit 951 (GR), a fast Fourier transform circuit 952 (FFT), a segment separation circuit 953 (SS), an error correction circuit 954 (DEC), and a transport stream structure circuit 955 (TR).

[Modulator]

Figure 10C:
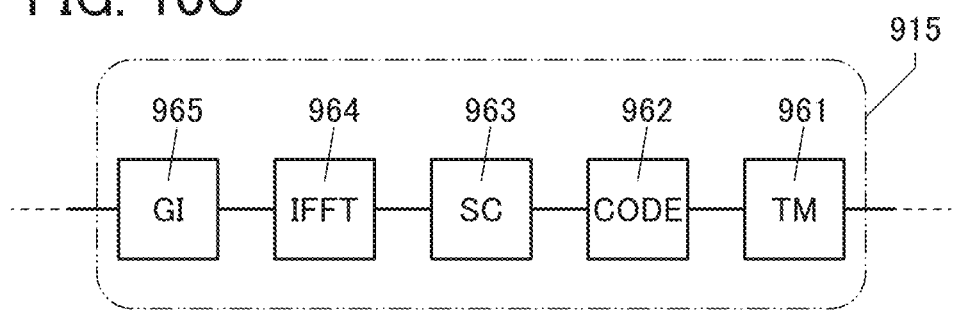
FIG. 10C is a diagram illustrating a structure example of a modulator.

FIG. 10C illustrates a structure example of the modulator 915. The modulator 915 illustrated in FIG. 10C includes a transmodulation circuit 961 (TM), a data rearrangement circuit 962 (CODE), a signal synthesizing circuit 963 (SC), a fast inverse Fourier transform circuit 964 (IFFT), and a guard interval insertion circuit 965 (GI).

The demodulator 905 and the modulator 915 are included in a signal processing device 414 described later. The signal processing device 414 may include an analog to digital converter circuit (ADC) or a digital to analog converter circuit (DAC).

<Amplifier Circuit>

FIG. 1A illustrates a circuit diagram of a semiconductor device 100 that can be used in the low noise amplifier 901 and the power amplifier 911. The semiconductor device 100 includes a transistor 101, a transistor 102, a functional element 103, a transistor 112, and a capacitor 113.

One of a source and a drain of the transistor 101 is electrically connected to a terminal 121, and the other is electrically connected to one of a source and a drain of the transistor 102 through a node 104. A gate of the transistor 101 is electrically connected to a terminal IN. The other of the source and the drain of the transistor 102 is electrically connected a terminal OUT. The other of the source and the drain of the transistor 102 is electrically connected to a terminal 122 through the functional element 103. One of a source and a drain of the transistor 112 is electrically connected to a terminal 123, and the other is electrically connected to a gate of the transistor 102 through a node 114. The other of the source and the drain of the transistor 112 is electrically connected to one electrode of the capacitor 113. A gate of the transistor 112 is electrically connected to a terminal 124. The other electrode of the capacitor 113 is electrically connected to a terminal 125. The functional element 103 may be a resistor or a constant current source.

The semiconductor device 100 functions as a cascode circuit. Thus, a mirror effect can be inhibited and excellent high-frequency characteristics and high gain can be achieved. Furthermore, the semiconductor device has characteristics of being less likely to be affected by fluctuation of the impedance of a circuit connected to a subsequent stage by a high isolation. In the semiconductor device 100, the voltage of the node 104 is less likely to change even when the gate voltage of the transistor 101 changes. Thus, the transistor 101 can be stably operated in a saturation region.

Figure 1B:
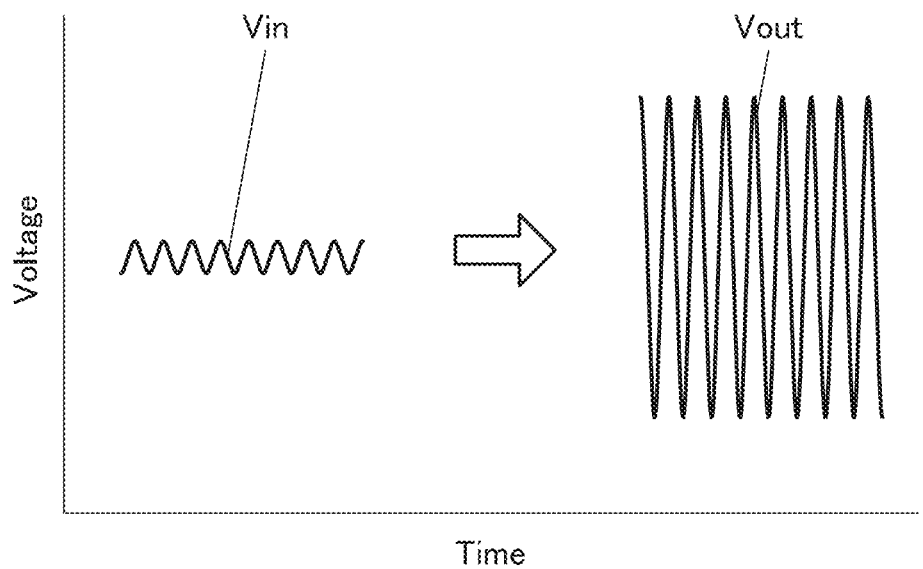
FIG. 1B is a conceptual diagram of an operation of a semiconductor device.

FIG. 1B is a conceptual diagram of an operation of the semiconductor device 100. In FIG. 1B, the vertical axis represents voltage and the horizontal axis represents time. The semiconductor device 100 has a function of amplifying a voltage Vin supplied to the terminal IN and outputting the voltage to the terminal OUT as a voltage Vout. Note that the voltage Vin is a signal in which a DC bias is added to an AC signal. The semiconductor device 100 has a function of amplifying an AC signal included in the voltage Vin and outputting the voltage as the voltage V out.

VSS is supplied to the terminal 121 and VDD is supplied to the terminal 122. In the case where the semiconductor device 100 is used in the low noise amplifier 901, the signal 941 is supplied to the terminal IN of the semiconductor device 100. In the case where the semiconductor device 100 is used in the power amplifier 911, the signal passed through the band pass filter 912 is supplied to the terminal IN of the semiconductor device 100.

The signal 941 and the signal passed through the band pass filter 912 are both AC signals. For example, in the case where the signal 941 is amplified by the semiconductor device 100, the signal 941 to which a DC bias is added is supplied to the terminal IN. The DC bias is a signal to keep the on state of the transistor 101.

The transistor 102 has a function of determining an amplification factor (also referred to as "gain") of the semiconductor device 100. As the resistance value of the functional element 103 is larger, the gain of the semiconductor device 100 is larger. The gain of the semiconductor device 100 is also changed by the transconductance (also referred to as "$g_m$") of the transistor 102. The $g_m$ of the transistor 102 can be adjusted with the gate voltage of the transistor 102. Accordingly, the gain of the semiconductor device 100 can be adjusted with the voltage of the node 114.

The transistor 112 has a function of writing a voltage to the node 114. Specifically, a voltage for bringing the transistor 112 into an on state is supplied to the terminal 124 to make conductivity between the terminal 123 and the node 114. Then, charge for setting the node 114 to a predetermined voltage is supplied from the terminal 123 to the node 114. After the writing ends, a voltage for bringing the transistor 112 into an off state is supplied to the terminal 124. The charge written to the node 114 can be retained when the transistor 112 is turned off For semiconductor layers of the transistor 101, the transistor 102, and the transistor 112, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used.

Alternatively, gallium arsenide, aluminum gallium arsenide, indium gallium arsenide, gallium nitride, indium phosphide, silicon germanium, or the like that can be used for a high electron mobility transistor (HEMT) may be used.

Note that semiconductor layers may be stacked. In the case of stacking semiconductor layers, semiconductors having different crystal states may be used or different semiconductor materials may be used.

A transistor including an oxide semiconductor (OS), which is one kind of metal oxide, in a semiconductor layer where a channel is formed (such a transistor is also referred to as an "OS transistor" or "OS-FET") is preferably used as the transistor 112. An oxide semiconductor has a band gap of 2 eV or more and thus has an extremely low off-state current. When an OS transistor is used as the transistor 112, charge written to the node 114 can be retained for a long time.

When the transistor 112 is turned off, the node 114 is brought into an electrically floating state (also referred to as a "floating state"). When the transistor 112 is in the floating state, the voltage of the node 114 is likely to change following an ambient potential change. The capacitor 113 has a function of making the node 114 to be less likely to be affected by the ambient potential change.

Thus, it can be said that the semiconductor device 100 has a configuration in which a memory element 111 including the transistor 112 and the capacitor 113 is connected to the gate of the transistor 102. In particular, in the case where an OS transistor is used as the transistor 112, the memory element 111 can be referred to as an "OS memory".

An OS memory can retain written data in a period of one year or longer, or 10 years or longer even after power supply is stopped. Thus, the OS memory can be regarded as a nonvolatile memory.

An OS memory employs a method in which charge is written to the node through the OS transistor; hence, a high voltage, which a conventional flash memory requires, is unnecessary and a high-speed writing operation can be achieved. Furthermore, the number of data writing and reading in an OS memory is substantially unlimited because charge injection and extraction into/from a floating gate or a charge trap layer are not performed. An OS memory is less likely to degrade than a conventional flash memory and can have high reliability.

Unlike a magnetic memory, a resistive random access memory, or the like, an OS memory has no change in the structure at the atomic level. Thus, an OS memory has higher rewrite endurance than a magnetic memory and a resistive random access memory.

When the gate of the transistor 102 is provided with the memory element 111, it is unnecessary to supply power continuously to the gate of the transistor 102. Thus, the power consumption of the semiconductor device 100 can be reduced.

OS transistors may be used as the transistor 101 and the transistor 102. The off-state current of an OS transistor hardly increases even in a high-temperature environment. Specifically, the off-state current hardly increases even at an environment temperature higher than or equal to room temperature and lower than or equal to 200° C. In addition, the on-state current of an OS transistor is less likely to decrease even in the high-temperature environment. Furthermore, the withstand voltage between a source and a drain of an OS transistor is high. A semiconductor device in which OS transistors are used as transistors achieves stable operation and high reliability even in a high-temperature environment.

Figure 9A:
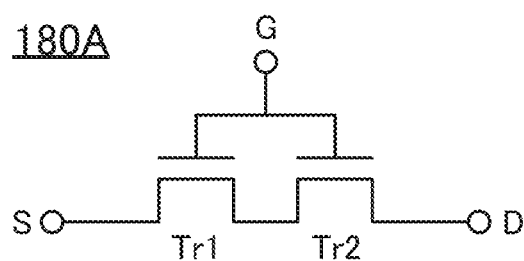
FIG. 9A and FIG. 9B are diagrams illustrating circuit symbols of transistors.

Each of the transistor 101, the transistor 102, and the transistor 112 may be a double-gate transistor. FIG. 9A illustrates a circuit symbol example of a double-gate transistor 180A.

The transistor 180A has a structure in which a transistor Tr1 and a transistor Tr2 are connected in series. FIG. 9A illustrates a state in which one of a source and a drain of the transistor Tr1 is electrically connected to a terminal S, the other of the source and the drain of the transistor Tr1 is electrically connected to one of a source and a drain of the transistor Tr2, and the other of the source and the drain of the transistor Tr2 is electrically connected to a terminal D. FIG. 9A illustrates a state in which gates of the transistor Tr1 and the transistor Tr2 are electrically connected to each other and electrically connected to a terminal G.

The transistor 180A illustrated in FIG. 9A has a function of switching a conduction state and a non-conduction state between the terminal S and the terminal D by changing the potential of the terminal G. Thus, the transistor 180A which is a double-gate transistor functions as one transistor including the transistor Tr1 and the transistor Tr2. In other words, it can be said that in FIG. 9A, one of a source and a drain of the transistor 180A is electrically connected to the terminal S, the other of the source and the drain thereof is electrically connected to the terminal D, and a gate thereof is electrically connected to the terminal G.

Figure 9B:
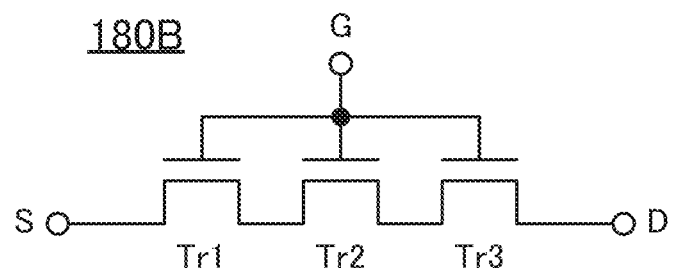

Each of the transistor 101, the transistor 102, and the transistor 112 may be a triple-gate transistor. FIG. 9B illustrates a circuit symbol example of a triple-gate transistor 180B.

The transistor 180B has a structure in which the transistor Tr1, the transistor Tr2, and a transistor Tr3 are connected in series. FIG. 9B illustrates a state where the one of the source and the drain of the transistor Tr1 is electrically connected to the terminal S, the other of the source and the drain of the transistor Tr1 is electrically connected to the one of the source and the drain of the transistor Tr2, the other of the source and the drain of the transistor Tr2 is electrically connected to one of a source and a drain of the transistor Tr3, and the other of the source and the drain of the transistor Tr3 is electrically connected to the terminal D. FIG. 9B illustrates a state in which gates of the transistor Tr1, the transistor Tr2, and the transistor Tr3 are electrically connected to each other and electrically connected to the terminal G.

The transistor 180B illustrated in FIG. 9B has a function of switching a conduction state and a non-conduction state between the terminal S and the terminal D by changing the potential of the terminal G. Thus, the transistor 180B which is a triple-gate transistor functions as one transistor including the transistor Tr1, the transistor Tr2, and the transistor Tr3. In other words, it can be said that in FIG. 9B, one of a source and a drain of the transistor 180B is electrically connected to the terminal S, the other of the source and the drain thereof is electrically connected to the terminal D, and a gate thereof is electrically connected to the terminal G.

Like the transistor 180A and the transistor 180B, a transistor including a plurality of gates electrically connected to each other is referred to as a "multi-gate type transistor" or a "multi-gate transistor" in some cases.

At least one of the transistor 101, the transistor 102, and the transistor 112 may include a back gate.

The back gate is placed so that a channel formation region of a semiconductor layer is sandwiched between the gate and the back gate. By changing the potential of the back gate, the threshold voltage of the transistor can be changed. The potential of the back gate may be the same as the potential of the gate or may be a GND potential or a given potential. The back gate can function in a manner similar to that of the gate. Thus, the gate and the back gate can be used interchangeably. For example, one of a gate and a back gate is referred to as a "first gate" and the other is referred to as a "second gate", in some cases.

In general, the gate and the back gate are formed using conductive layers and thus each have a function of preventing an electric field generated outside the transistor from influencing the semiconductor layer in which a channel is formed (particularly, a function of preventing static electricity). That is, a change in the electrical characteristics of the transistor due to the influence of an external electric field such as static electricity can be prevented.

The threshold voltage of the transistor 102 may be smaller than the threshold voltage of the transistor 101. The transistor 102 may be a normally-on transistor.

The ratio of the channel width W to the channel length L (also referred to as "W/L ratio") of the transistor 102 is preferably larger than the W/L ratio of the transistor 101. In the case where the channel length L of the transistor 102 and the channel length L of the transistor 101 are the same, the channel width W of the transistor 102 is preferably larger than the channel width W of the transistor 101.

Figure 2A:
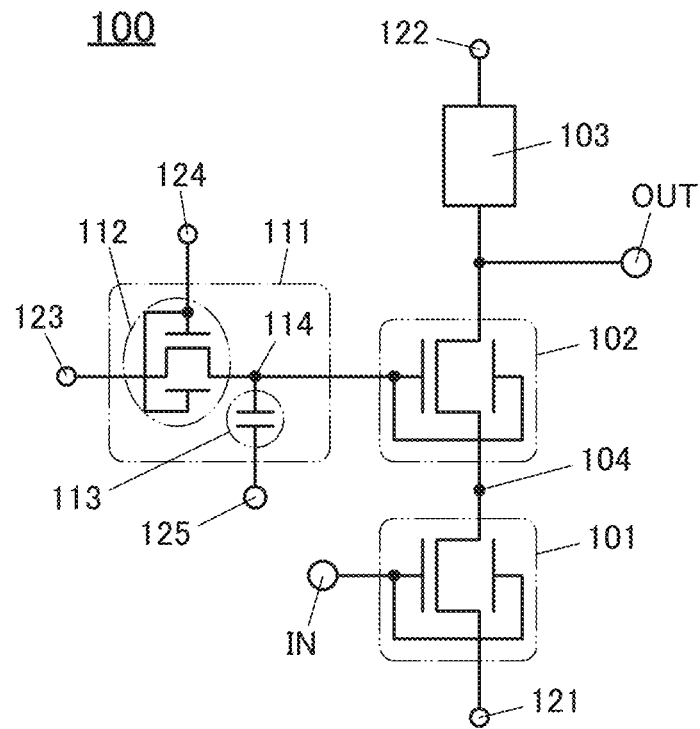
FIG. 2A and FIG. 2B are circuit diagrams of a semiconductor device.
Figure 2B:
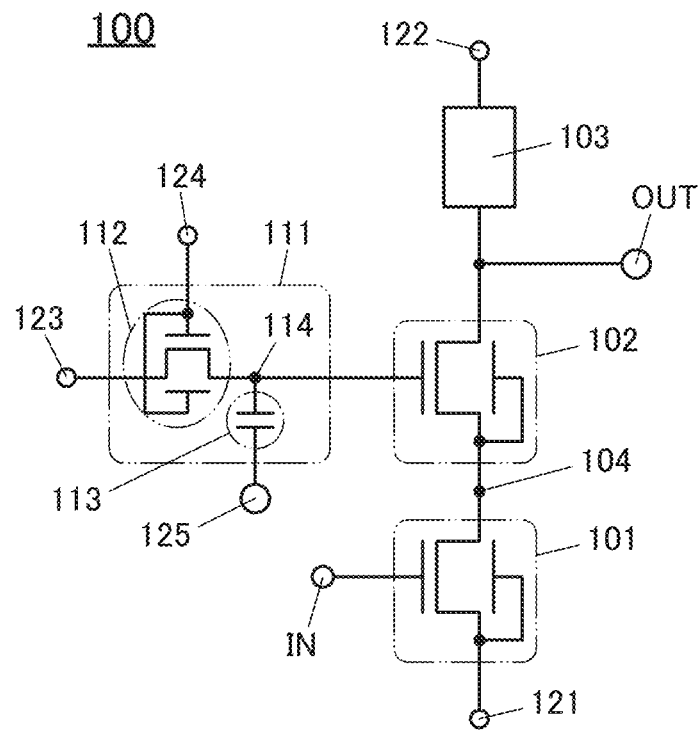

FIG. 2A and FIG. 2B illustrate circuit diagrams of the semiconductor device 100 in the case where the transistor 101, the transistor 102, and the transistor 112 each include a back gate. Although FIG. 2A illustrates an example in which a gate and a back gate of each transistor are electrically connected, one embodiment of the present invention is not limited thereto. FIG. 2B illustrates an example in which one of the source and the drain of the transistor 101 and its back gate are electrically connected. In addition, FIG. 2B illustrates an example in which one of the source and the drain of the transistor 102 and its back gate are electrically connected.

The semiconductor device 100 can be used for a variety of circuits. For example, the semiconductor device 100 may be used for a source-grounded amplifier circuit included in an operational amplifier.

Modification Example 1

Figure 3A:
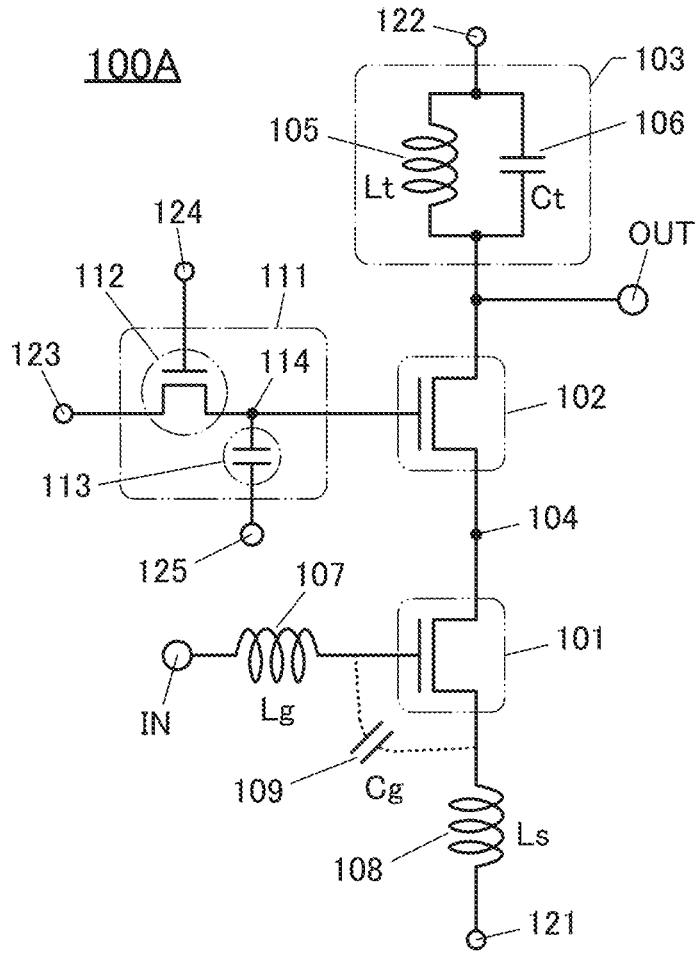
FIG. 3A is a circuit diagram of a semiconductor device.

FIG. 3A illustrates a circuit diagram of a semiconductor device 100A. The semiconductor device 100A is a modification example of the semiconductor device 100 illustrated in FIG. 1A. In order to reduce repeated description, differences of the semiconductor device 100A from the semiconductor device 100 are mainly described.

Figure 4A:
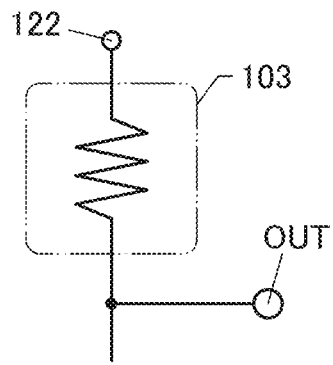
FIG. 4A to FIG. 4D are diagrams illustrating configuration examples of functional elements.
Figure 4B:
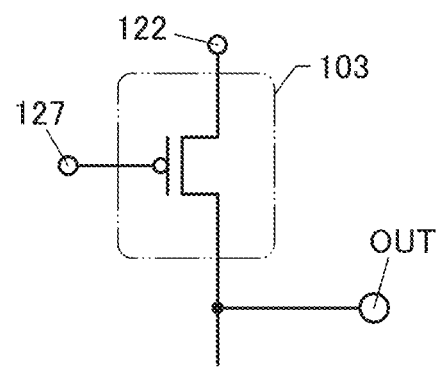

As the functional element 103, one kind or a combination of various kinds of a resistor, a coil, a capacitor, a diode, a transistor, and the like can be used. FIG. 4A illustrates a circuit diagram in the case where a resistor is used as the functional element 103. FIG. 4B illustrates a circuit diagram in the case where a transistor is used as the functional element 103. The transistor used as the functional element 103 may be a p-channel transistor or an n-channel transistor. A gate of the transistor used as the functional element 103 is electrically connected to a terminal 127. A constant voltage is supplied to the gate of the transistor through the terminal 127.

Figure 4C:
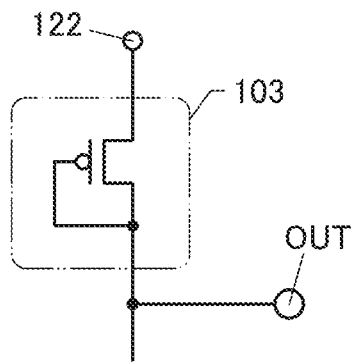
Figure 4D:
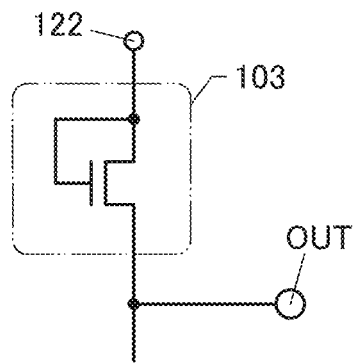

FIG. 4C and FIG. 4D illustrate circuit diagrams in the case where a diode-connected transistor is used as the functional element 103. A gate and a drain of the transistor are electrically connected to each other, whereby the transistor can function as a diode. FIG. 4C illustrates a configuration example in which a p-channel transistor is diode-connected. FIG. 4D illustrates a configuration example in which an n-channel transistor is diode-connected.

An example where a parallel resonant circuit (an LC tank circuit) in which a coil 105 and a capacitor 106 are connected in parallel is used as the functional element 103 in the semiconductor device 100A is illustrated. When the inductance of the coil 105 is Lt and the capacitance of the capacitor 106 is Ct, the resonance frequency $f_0$ is expressed by Formula 1.

[Formula 1]

$$f_0 = \frac{1}{2\pi\sqrt{LtCt}} \qquad (1)$$

Figure 3B:
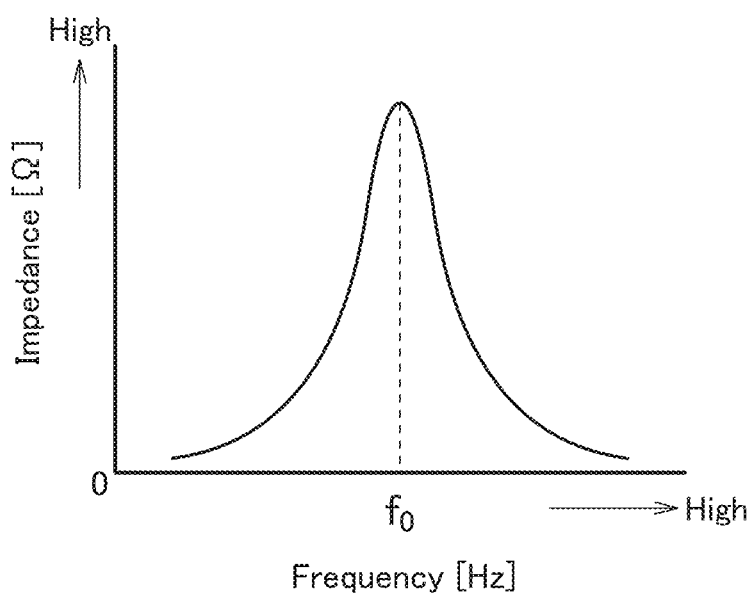
FIG. 3B is a graph showing a relation between the frequency of a signal passing through a parallel resonant circuit and the impedance of the parallel resonant circuit.

FIG. 3B is a graph showing a relation between the frequency of a signal passing through the parallel resonant circuit and the impedance of the parallel resonant circuit. In FIG. 3B, the horizontal axis represents the frequency and the vertical axis represents the impedance. The parallel resonant circuit has a maximum impedance when the resonance frequency is $f_0$. That is, when the frequency of a signal input to the terminal IN is equal to the resonance frequency $f_0$, the gain of the semiconductor device 100A can be maximized. Accordingly, it is preferable that the resonance frequency $f_0$ of the parallel resonant circuit be in accordance with the frequency of the signal input to the terminal IN.

The semiconductor device 100A includes a coil 107 between the gate of the transistor 101 and the terminal IN, and a coil 108 between one of the source and the drain of the transistor 101 and the terminal 121.

In a semiconductor device processing an AC signal, the impedance on a signal transmitting side and the impedance on a signal receiving side need to be equal (matched). Converting the impedance into a constant value is referred to as "impedance conversion" or "impedance matching". Impedance matching is performed so that the impedance becomes 50Ω in many cases.

The input impedance of the semiconductor device 100A can be adjusted by changing the inductance of the coil 107 and the coil 108. Here, the inductance of the coil 107 is Lg and the inductance of the coil 108 is Ls. The capacitance value of a parasitic capacitance 109 generated between the source and the gate of the transistor 101 is Cg and the transconductance of the transistor 101 is $g_{m1}$. Then, an input impedance $Z_{in}$ of the semiconductor device 100A can be expressed by Formula 2.

[Formula 2]

$$Z_{in} = \frac{g_{m1}Ls}{C_g} + j\left(\omega Lg + \omega Ls - \frac{1}{\omega C_g}\right) \qquad (2)$$

Changed are $g_{m1}$ and $C_g$ depending on the channel length and the channel width of the transistor 101. For example, when the input impedance $Z_{in}$ of the semiconductor device 100A matches with 50Ω, Lg and Ls can be determined such that a real part is 50 and an imaginary part is 0.

Like the semiconductor device 100 illustrated in FIG. 2A and FIG. 2B, a transistor including a back gate may be used as the transistor 101, the transistor 102, and the transistor 112.

Modification Example 2

Figure 5:
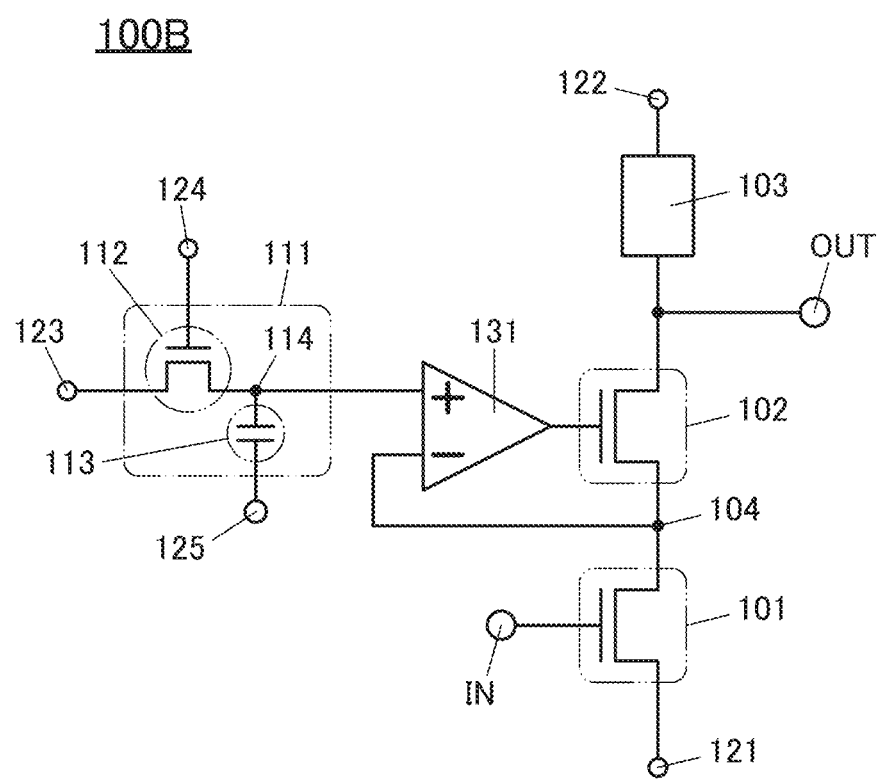
FIG. 5 is a circuit diagram of a semiconductor device.

FIG. 5 illustrates a circuit diagram of a semiconductor device 100B. The semiconductor device 100B is a modification example of the semiconductor device 100 illustrated in FIG. 1A. In order to reduce repeated description, differences of the semiconductor device 100B from the semiconductor device 100 are mainly described.

The semiconductor device 100B includes an operational amplifier 131 between the gate of the transistor 102 and the memory element 111. A non-inverting input of the operational amplifier 131 is electrically connected to the node 114 and an inverting input thereof is electrically connected to the node 104. An output of the operational amplifier 131 is electrically connected to the gate of the transistor 102.

The operational amplifier 131 changes an output voltage such that a voltage applied to the non-inverting input and a voltage applied to the inverting input are equal to each other. In the semiconductor device 100B, the operational amplifier 131 operates such that the voltage of the node 104 is equal to the voltage of the node 114. Thus, the voltage of the node 104 is less likely to change in the semiconductor device 100B than in the semiconductor device 100. The semiconductor device 100B operates more stably than the semiconductor device 100.

When the non-inverting input of the operational amplifier 131 is provided with the memory element 111, it is unnecessary to supply power continuously to the non-inverting input of the operational amplifier 131. Thus, the power consumption of the semiconductor device 100B can be reduced.

Modification Example 3

Figure 6A:
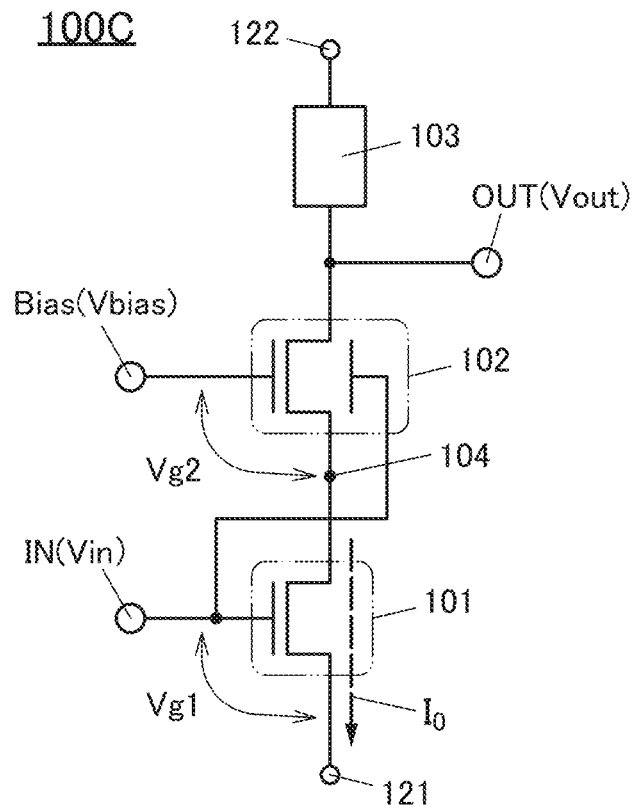
FIG. 6A is a circuit diagram of a semiconductor device.

FIG. 6A illustrates a circuit diagram of a semiconductor device 100C. The semiconductor device 100C is a modification example of the semiconductor device 100B illustrated in FIG. 5. In order to reduce repeated description, differences of the semiconductor device 100C from the semiconductor device 100B are mainly described.

In the semiconductor device 100C, the gate of the transistor 101 is electrically connected to the terminal IN and the back gate of the transistor 102. The semiconductor device 100C has a function of supplying an input signal supplied to the terminal IN to the gate of the transistor 101 and the back gate of the transistor 102. The gate of the transistor 102 is electrically connected to a terminal Bias.

Figure 6B:
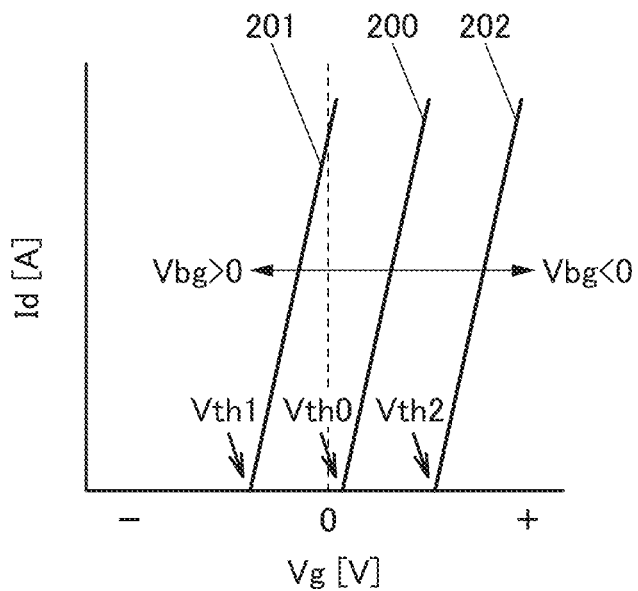
FIG. 6B is a graph showing a relation between the back gate voltage and Id-Vg characteristics.

Here, a relation between a voltage (Vbg) supplied to a back gate of a transistor including a back gate and transistor characteristics is described with reference to FIG. 6B. FIG. 6B is a graph showing Id-Vg characteristics, one of electrical characteristics of a transistor. In FIG. 6B, the horizontal axis represents a gate voltage (Vg) on a linear scale and the vertical axis represents a current (Id) flowing between a source and a drain on a linear scale.

Id-Vg characteristics 200 shown in FIG. 6B are Id-Vg characteristics when Vbg is 0 V. Id-Vg characteristics 201 are Id-Vg characteristics when Vbg is a positive voltage. Id-Vg characteristics 202 are Id-Vg characteristics when Vbg is a negative voltage.

In FIG. 6B, the threshold voltage of the Id-Vg characteristics 200 is denoted by Vth0, the threshold voltage of the Id-Vg characteristics 201 is denoted by Vth1, and the threshold voltage of the Id-Vg characteristics 202 is denoted by Vth2.

Based on the Id-Vg characteristics 200 with Vbg of 0 V, the Id-Vg characteristics shift in the negative direction when Vbg is a positive voltage (the Id-Vg characteristics 201). Thus, Vth1 also shifts in the negative direction. The Id-Vg characteristics shift in the positive direction (the Id-Vg characteristics 202) when Vbg is a negative voltage. Thus, Vth1 also shifts in the positive direction. The shift amount of the threshold voltage is changed depending on Vbg. FIG. 6B shows that the threshold voltage of the transistor is changed depending on Vbg.

Next, the operation of the semiconductor device 100C is described. As a prerequisite, VSS is supplied to the terminal 121 and VDD is supplied to the terminal 122. Thus, in the transistor 101, the source or the drain on the terminal 121 side functions as a source, and the source or the drain on the node 104 side functions as a drain. In the transistor 102, the source or the drain on the node 104 side functions as a source, and the source or the drain on the functional element 103 side functions as a drain. Furthermore, a voltage Vbias that is a fixed voltage is supplied to the terminal Bias. Note that the voltage Vbias is a voltage for bringing the transistor 102 into an on state.

In FIG. 6A, the gate voltage (a voltage between a gate and a source) of the transistor 101 is Vg1 and the gate voltage of the transistor 102 is Vg2. Vg1 is a potential difference between the terminal IN and the terminal 121 when the terminal 121 is regarded as a reference. Vg2 is a potential difference between the terminal Bias and the node 104 when the node 104 is regarded as a reference.

Note that since the semiconductor device 100C is an amplifier circuit, it is preferable that the transistor 101 and the transistor 102 operate in a saturation region.

When the voltage Vin increases, the Id of the transistor 101 increases. The Id of the transistor 101 and a current $I_0$ flowing between the terminal 122 and the terminal 121 are equal to each other. That is, the current $I_0$ increases in accordance with a rise of the voltage Vin.

In accordance with the increase in the current $I_0$, the transistor 102 operates to increase the Id thereof. That is, the transistor 102 operates to increase Vg2. At this time, the voltage Vbias is fixed and thus the potential of the node 104 that is on the source side decreases. This means that as the voltage Vin increases, the potential of the node 104 decreases and thus the operation region of the transistor 101 gets closer to a linear region.

In the semiconductor device 100C of one embodiment of the present invention, by supplying the voltage Vin to the back gate of the transistor 102 and the gate of the transistor 101 simultaneously, whereby the threshold voltage of the transistor 102 is changed actively and a decrease in the potential of the node 104 can be reduced.

Specifically, in the semiconductor device 100C, the back gate voltage of the transistor 102 rises (shifts in the positive direction) in accordance with a rise of the voltage Vin. As described above, when the back gate voltage shifts in the positive direction, the threshold voltage of the transistor 102 shifts in the negative direction (see FIG. 6B). The shift amount of the threshold voltage is changed depending on the back gate voltage, whereby as the voltage Vin rises, the shift amount of the threshold voltage increases.

In the case where the transistor 102 operates in a saturation region, the Id of the transistor 102 is changed in proportion to the square of the voltage obtained by subtracting the threshold voltage from Vg2. When the threshold voltage shifts in the negative direction (the threshold voltage decreases), the amount of change in Vg2 can be small. Thus, a decrease in the potential of the node 104 can be suppressed.

Note that the semiconductor device 100B described above has a function of inhibiting a change in the potential of the node 104 by using the operational amplifier 131. Note that the semiconductor device 100B using the operational amplifier 131 tends to have a large occupation area. The semiconductor device 100C described in this embodiment can inhibit the change in the potential of the node 104 without using the operational amplifier 131. In addition, the semiconductor device 100C described in this embodiment can operate the transistor 101 in a saturation region regardless of the input signal. According to one embodiment of the present invention, a semiconductor device can operate stably and have higher reliability.

Figure 7A:
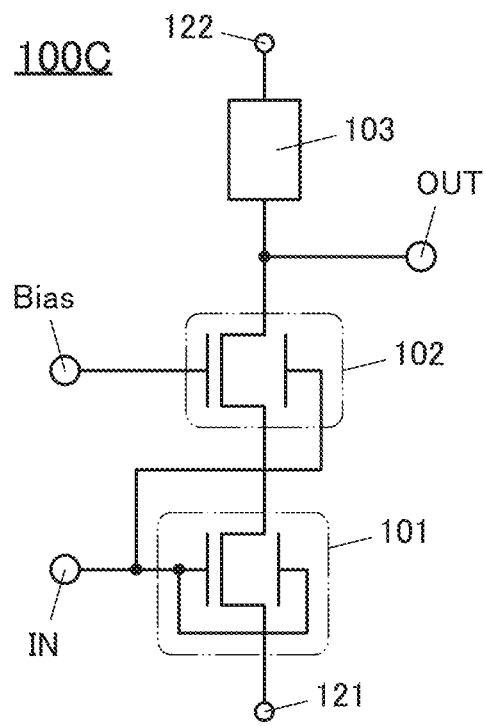
FIG. 7A to FIG. 7C are circuit diagrams of semiconductor devices.
Figure 7B:
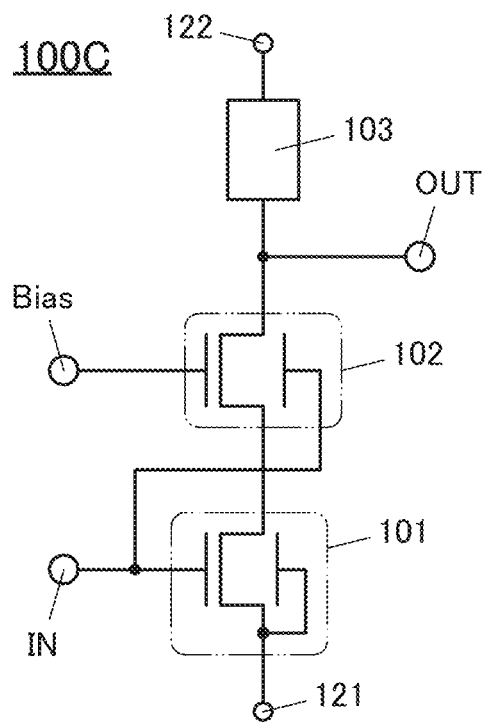
Figure 7C:
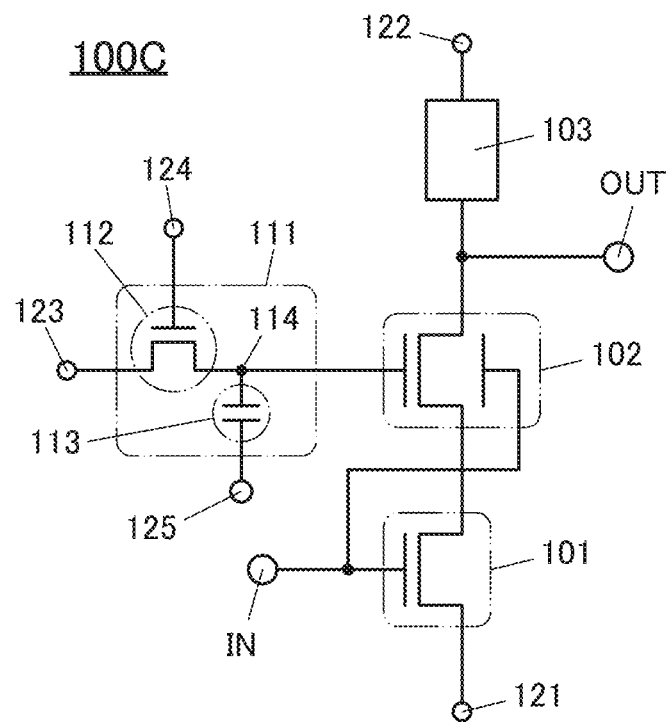

FIG. 7A and FIG. 7B illustrate circuit diagrams of the semiconductor device 100C in the case where the transistor 101 includes a back gate. FIG. 7A illustrates an example in which the gate and the back gate of the transistor 101 are electrically connected. FIG. 7B illustrates an example in which one of the source and the drain of the transistor 101 and its back gate are electrically connected. As illustrated in FIG. 7C, the gate of the transistor 102 may be provided with the memory element 111 like the semiconductor device 100.

Figure 8A:
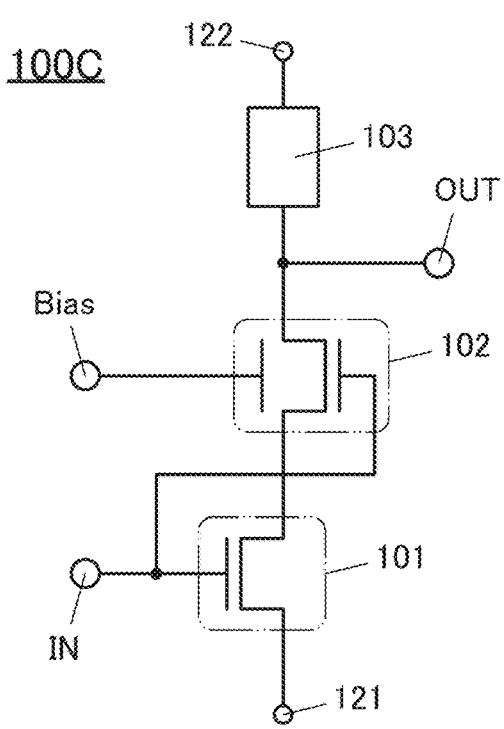
FIG. 8A to FIG. 8C are circuit diagrams of semiconductor devices.
Figure 8B:
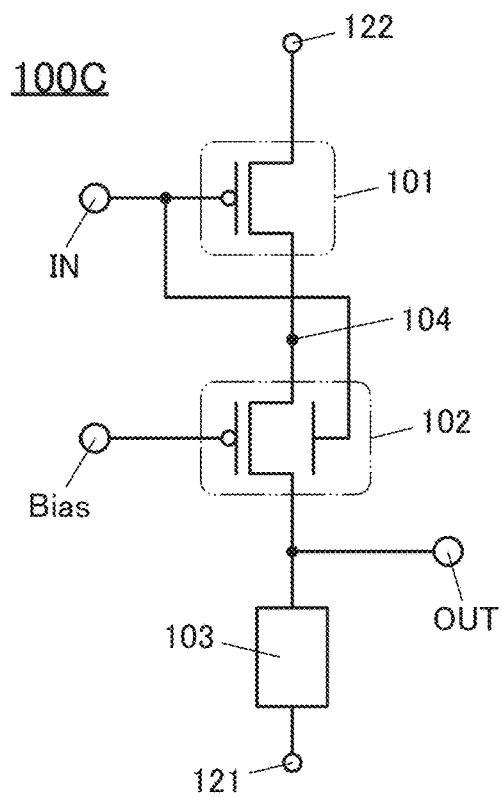

As illustrated in FIG. 8A, the gate and the back gate of the transistor 102 may be interchanged with each other. In the semiconductor device 100C illustrated in FIG. 8A, the terminal IN and the gate of the transistor 102 are electrically connected and the terminal Bias and the back gate of the transistor 102 are electrically connected. As in the semiconductor device 100C illustrated in FIG. 8B, p-channel transistors may be used as the transistor 101 and the transistor 102. In this case, the transistor 101 is provided on the terminal 122 side. The functional element 103 is electrically connected to the terminal 121.

Figure 8C:
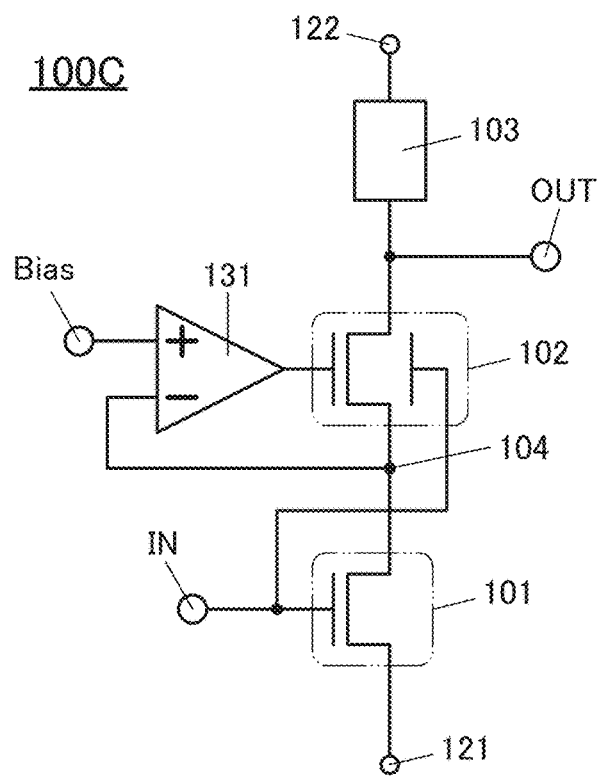

As in the semiconductor device 100C illustrated in FIG. 8C, the operational amplifier 131 may be provided between the gate of the transistor 102 and the terminal Bias. The non-inverting input of the operational amplifier 131 is electrically connected to the terminal Bias and the inverting input thereof is electrically connected to the node 104. The output of the operational amplifier 131 is electrically connected to the gate of the transistor 102.

The composition, structure, method, and the like described in this embodiment can be used in combination as appropriate with the compositions, structures, methods, and the like described in the other embodiments, the example, and the like.

Embodiment 2

In this embodiment, a wireless transceiver 900A, which is a modification example of the wireless transceiver 900 described in the above embodiment, is described with reference to FIG. 11A and FIG. 11B. In order to reduce repeated description, differences of the wireless transceiver 900A from the wireless transceiver 900 are mainly described.

The wireless transceiver 900A includes a plurality of antennas 931 to correspond to a communication standard of 5G. In addition, the wireless transceiver 900A includes a plurality of duplexers 921, a plurality of low noise amplifiers 901, and a plurality of power amplifiers 911. Furthermore, the wireless transceiver 900A includes a decoder circuit 906 (DEC) and a decoder circuit 916.

Figure 11A:
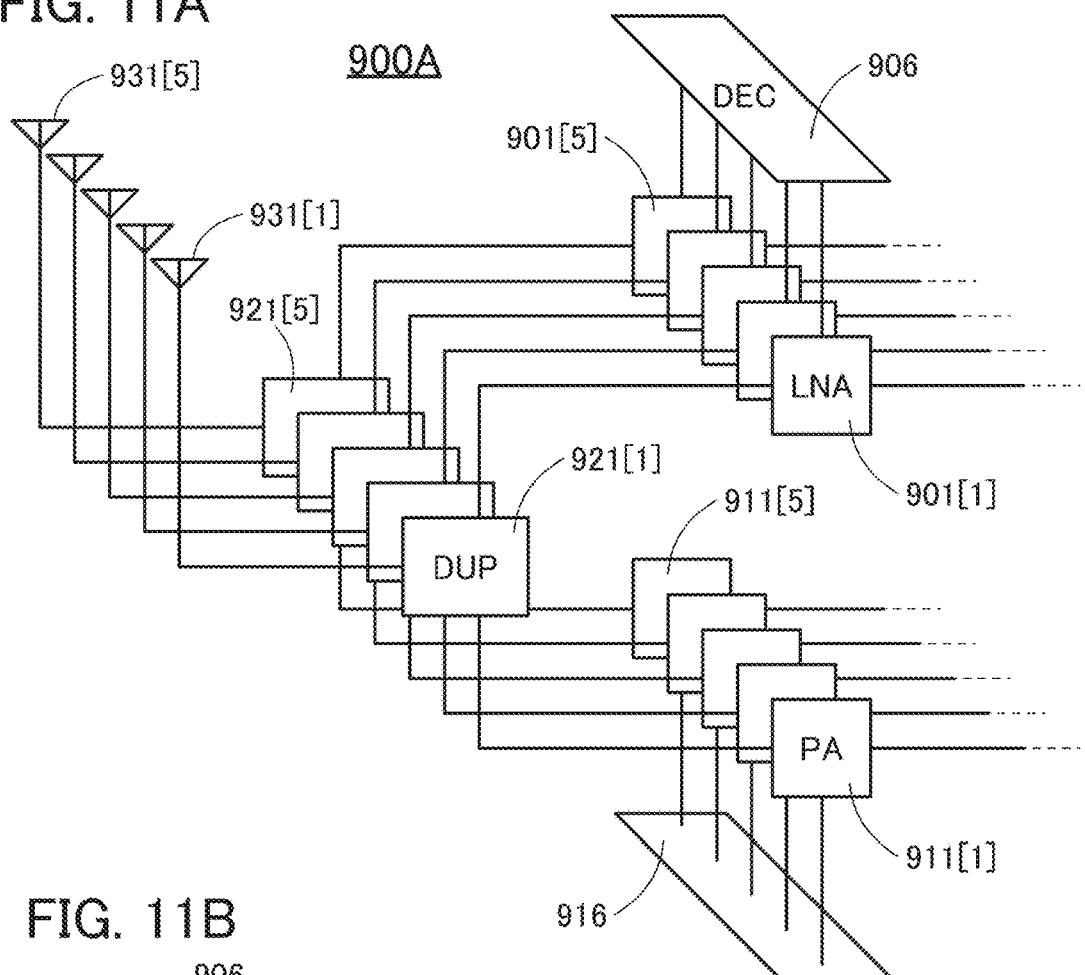
FIG. 11A and FIG. 11B are diagrams illustrating a structure example of a wireless transceiver.

FIG. 11A illustrates a case where the wireless transceiver 900A includes five antennas 931, five duplexers 921, five low noise amplifiers 901, and five power amplifiers 911. In FIG. 11A, the first antenna 931 is denoted by an antenna 931[1] and the fifth antenna 931 is denoted by an antenna 931[5]. The duplexers 921, the low noise amplifiers 901, and the power amplifiers 911 are also denoted in a manner similar to the antennas 931. Note that the number of each of the antennas 931, the duplexers 921, the low noise amplifiers 901, and the power amplifiers 911 is not limited to five.

The antenna 931[1] is electrically connected to a duplexer 921[1]. The duplexer 921[1] is electrically connected to a low noise amplifier 901[1] and a power amplifier 911[1]. The antenna 931[5] is electrically connected to a duplexer 921[5]. The duplexer 921[5] is electrically connected to a low noise amplifier 901[5] and a power amplifier 911[5]. Like the antenna 931[1], the second to the fourth antennas 931 are also electrically connected to the second to the fourth duplexers 921, respectively. In addition, like duplexer 921[1], the second to the fourth duplexers 921 are also electrically connected to the second to the fourth low noise amplifiers 901 and the second to the fourth power amplifiers 911, respectively.

The decoder circuit 906 is electrically connected to the plurality of low noise amplifiers 901. In FIG. 11A, five low noise amplifiers 901 are connected to the decoder circuit 906. In addition, the decoder circuit 916 is electrically connected to the plurality of power amplifiers 911. In FIG. 11A, five power amplifiers 911 are connected to the decoder circuit 916.

The decoder circuit 906 has a function of selecting any one or a plurality of the low noise amplifier 901[1] to the low noise amplifier 901[5]. Furthermore, the decoder circuit 906 has a function of sequentially selecting the low noise amplifier 901[1] to the low noise amplifier 901[5]. Similarly, the decoder circuit 916 has a function of selecting any one or a plurality of the power amplifier 911[1] to the power amplifier 911[5]. Furthermore, the decoder circuit 916 has a function of sequentially selecting the power amplifier 911[1] to the power amplifier 911[5].

Figure 11B:
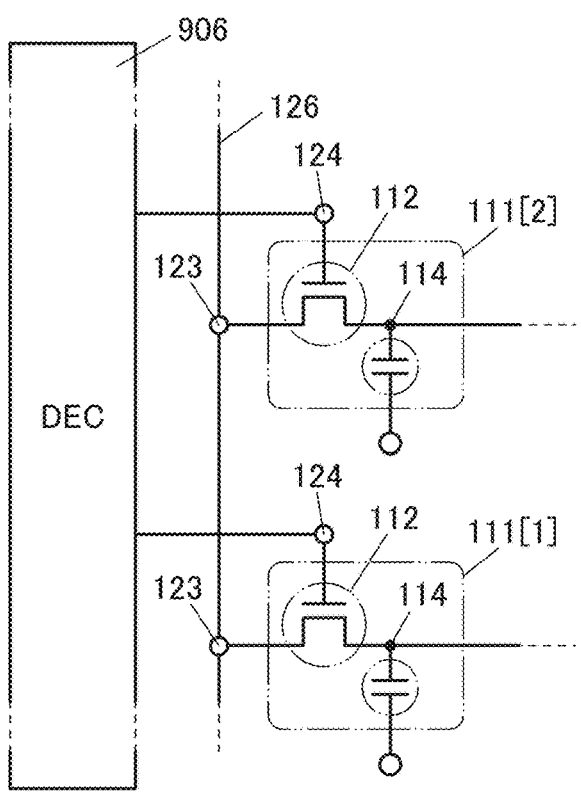

As an example, a connection example of the decoder circuit 906 and the low noise amplifier 901[1] and a low noise amplifier 901[2] is illustrated in FIG. 11B. The decoder circuit 906 is electrically connected to the memory element 111 (denoted by a memory element 111[1]) included in the low noise amplifier 901[1] through the terminal 124 electrically connected to the memory element 111[1]. The decoder circuit 906 is electrically connected to the memory element 111 (denoted by a memory element 111[2]) included in the low noise amplifier 901[2] through the terminal 124 electrically connected to the memory element 111[2].

The terminal 123 electrically connected to the memory element 111[1] and the terminal 123 electrically connected to the memory element 111[2] are electrically connected to a wiring 126. A voltage (charge) written to the node 114 is supplied through the wiring 126.

The decoder circuit 906 has a function of supplying a signal to turn on or off the transistor 112 to the terminal 124 electrically connected to a given memory element 111. The decoder circuit 906 sequentially selects the memory element 111 in each of the low noise amplifiers 901, whereby a voltage written to the node 114 can be vary among the memory elements 111. In other words, a voltage suitable for each of the plurality of low noise amplifiers 901 can be written to the node 114.

The decoder circuit 916 also functions in a manner similar to the decoder circuit 906 with respect to the plurality of power amplifiers 911.

The composition, structure, method, and the like described in this embodiment can be used in combination as appropriate with the compositions, structures, methods, and the like described in the other embodiments, the example, and the like.

Embodiment 3

Figure 12A:
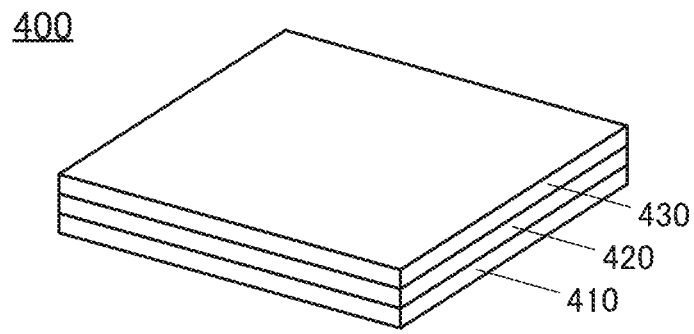
FIG. 12A is a perspective view of a semiconductor device 400.
Figure 12B:
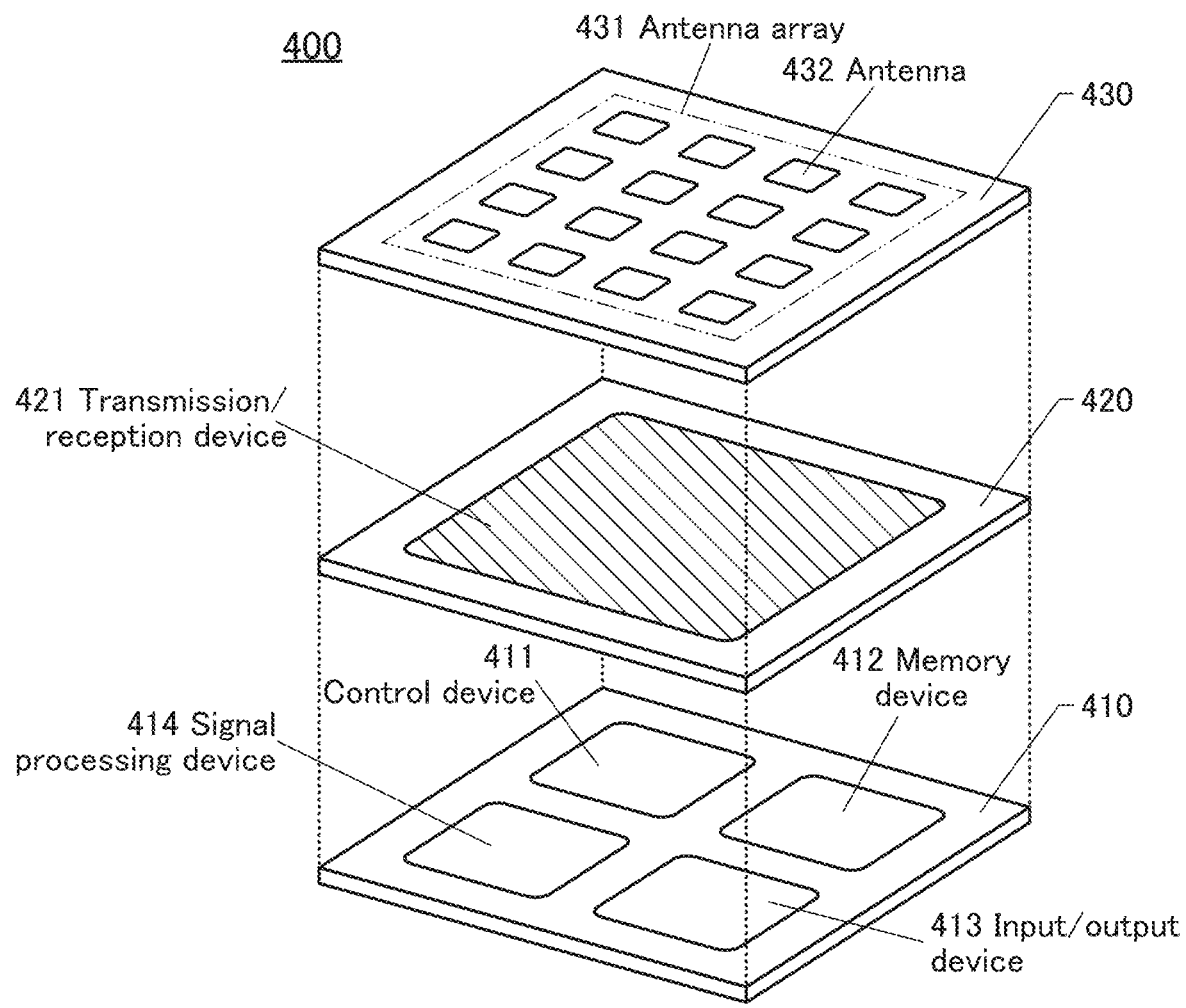
FIG. 12B is a perspective view illustrating a structure of the semiconductor device 400.

The wireless transceiver 900 of one embodiment of the present invention may be stacked over a digital circuit. FIG. 12A illustrates a perspective view of a semiconductor device 400. The semiconductor device 400 includes a layer 410, a layer 420, and a layer 430. FIG. 12B is a perspective view for illustrating a structure of the semiconductor device 400, and the layer 410, the layer 420, and the layer 430 are separately illustrated.

The layer 410 includes a digital circuit. For example, the layer 410 includes a control device 411, a memory device 412, an input/output device 413, the signal processing device 414, and the like. The control device 411 has a function of controlling the operation of the whole semiconductor device 400.

[Control Device 411]

As the control device 411, microprocessors such as a central processing unit (CPU), a DSP (Digital Signal Processor), and a GPU (Graphics Processing Unit) can be used alone or in combination. A structure may be employed in which such a microprocessor is obtained with a PLD (Programmable Logic Device) such as an FPGA (Field Programmable Gate Array) or an FPAA (Field Programmable Analog Array).

[Memory Device 412]

As the memory device 412, a memory device using a nonvolatile memory element, such as a flash memory, an MRAM (Magnetoresistive Random Access Memory), a PRAM (Phase change RAM), an ReRAM (Resistive RAM), or an FeRAM (Ferroelectric RAM); a memory device using a volatile memory element, such as a DRAM (Dynamic RAM) or an SRAM (Static RAM); or the like may be used, for example.

Note that the memory device 412 is not incorporated in the semiconductor device 400, and a memory device located outside the semiconductor device 400 may be used as the memory device 412. In that case, the memory device 412 is connected through the input/output device 413.

[Input/Output Device 413]

The input/output device 413 is electrically connected to an external port or the like, for example, and has a function of transmitting and receiving a signal to/from the outside. The semiconductor device 400 can transmit and receive a signal to/from another semiconductor device through the input/output device 413. The input/output device 413 may be electrically connected to an input component such as a button or a switch. Examples of the external port to which the input/output device 413 is electrically connected include a USB terminal or a LAN (Local Area Network) connection terminal.

[Signal Processing Device 414]

The signal processing device 414 has a function of processing a signal received by a transmission/reception device 421, and supplying the processed signal to the control device 411, the memory device 412, and the input/output device 413. For example, the signal processing device 414 has a function of returning a signal transmitted in division with spatial multiplex transmission such as MIMO (multiple-input and multiple-output) to the original signal (a demodulation function). In addition, when data is transmitted from the semiconductor device 400 to the outside with spatial multiplex transmission, the signal processing device 414 has a function of converting the data into a transmission signal for spatial multiplex transmission.

Note that MIMO is a technique for dividing a signal to be transmitted into a plurality of communication paths (also referred to as "streams" or "space streams") and transmitting them at the same time. One stream includes one transmission antenna and one receiving antenna. Thus, the maximum number of streams is the same as the smaller number of the transmission antennas and the receiving antennas. When the number of streams is 10, an apparent transfer speed can be decupled.

The layer 410 can be formed using a single crystal semiconductor, a polycrystalline semiconductor, a microcrystalline semiconductor, an amorphous semiconductor, or the like alone or in combination. As a semiconductor material, silicon, germanium, or the like can be used, for example. Alternatively, a compound semiconductor such as silicon germanium, silicon carbide, gallium arsenide, an oxide semiconductor, a nitride semiconductor, or the like may be used.

Alternatively, gallium arsenide, aluminum gallium arsenide, indium gallium arsenide, gallium nitride, indium phosphide, silicon germanium, or the like that can be used for a HEMT may be used.

The layer 420 includes a high frequency circuit and the like. For example, the layer 420 includes the transmission/reception device 421. As the transmission/reception device 421, the semiconductor device 100 described in the other embodiment can be used, for example. The transmission/reception device 421 may include a plurality of semiconductor devices 100 or the like.

The layer 420 can be provided using a semiconductor material that can be formed thin such as an oxide semiconductor or a silicon. Using a technique of forming a thin film can provide the digital circuit in the layer 410 and the high frequency circuit in the layer 420 three-dimensionally. Thus, the area occupied by the semiconductor device 400 can be reduced.

The mobility of an oxide semiconductor is less likely to decrease compared with that of a silicon or the like in a high-temperature environment. When an OS transistor is used as a transistor included in the layer 420, the circuit included in the layer 420 can be stably operated even when the temperature in the layer 410 increases. Consequently, the reliability of the semiconductor device can be improved.

The layer 420 may be formed over another substrate and attached to the layer 410.

The layer 430 includes an antenna array 431. The antenna array 431 includes a plurality of antennas 432. The antennas 432 correspond to the antennas 931 described in the other embodiments, for example. In the semiconductor device 400 illustrated in FIG. 12B, the antennas 432 are arranged in a matrix of four rows and four columns.

When the antenna array 431 is provided in the semiconductor device 400, a communication technology such as beamforming or spatial multiplex transmission in the semiconductor device 400 can be achieved. Note that beamforming is a communication technology for transmitting a radio wave using a plurality of antennas. Strength of directivity or a transmission direction can be adjusted by adjusting phase inversion of a radio wave to be transmitted from each antenna. Directivity of a transmission radio wave is enhanced, whereby the radio wave can be transmitted farther. A radio wave can be transmitted to a specific region by adjusting the transmission direction.

Modification Example 1

Figure 13A:
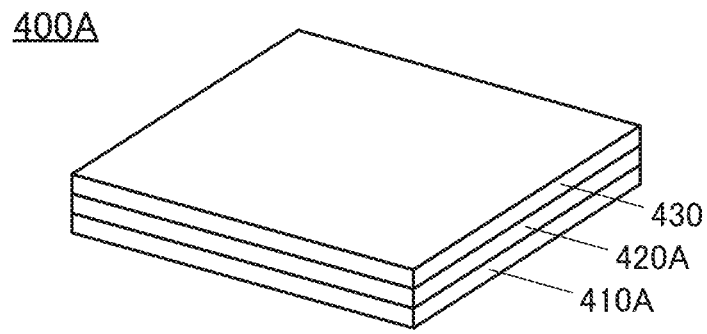
FIG. 13A is a perspective view of a semiconductor device 400A.

FIG. 13A illustrates a perspective view of a semiconductor device 400A. The semiconductor device 400A is a modification example of the semiconductor device 400. Accordingly, in order to avoid repeated description, differences of the semiconductor device 400A from the semiconductor device 400 are mainly described. The semiconductor device 400A includes a layer 410A and a layer 420A instead of the layer 410 and the layer 420 in the semiconductor device 400.

Figure 13B:
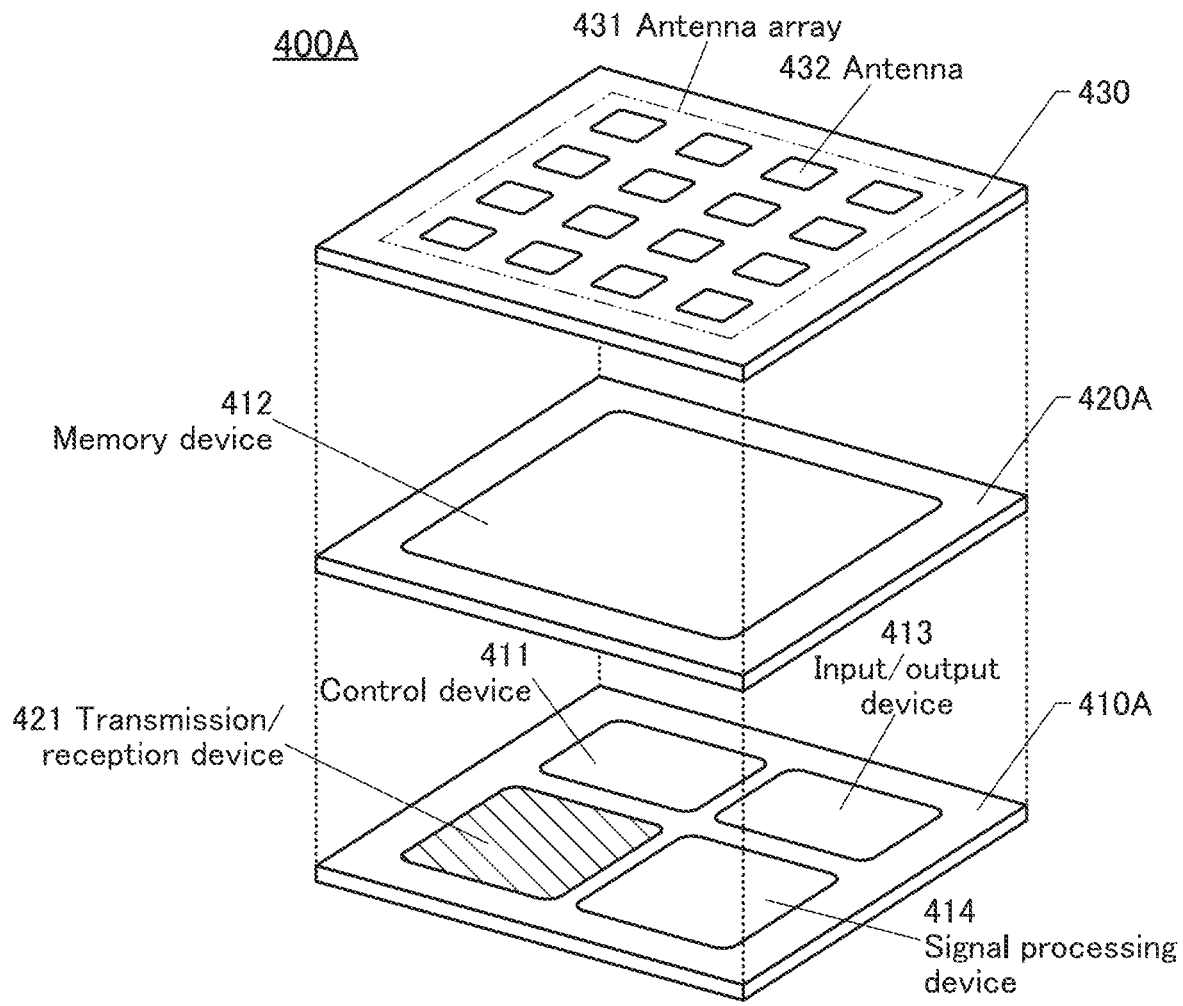
FIG. 13B is a perspective view illustrating a structure of the semiconductor device 400A.

FIG. 13B is a perspective view for illustrating a structure of the semiconductor device 400A. The wireless transceiver 900 of one embodiment of the present invention may be provided in the layer 410A together with a digital circuit or the like. The memory device 412 may be provided in the layer 420A.

The layer 410A includes the control device 411, the input/output device 413, the signal processing device 414, the transmission/reception device 421, and the like. As the transmission/reception device 421, the semiconductor device 100 described in the other embodiment can be used, for example. The transmission/reception device 421 may include a plurality of semiconductor devices 100 or the like.

The layer 420A includes the memory device 412. The memory device 412 provided in the layer 420A preferably uses an OS memory as a memory element. As described above, the off-state current of an OS transistor hardly increases even in a high-temperature environment. The OS memory is less likely to be affected by heat generation of the transmission/reception device 421, the signal processing device 414, and the like included in the layer 410A, and written data can be retained for a long time. Thus, a semiconductor device can achieve stable operation and high reliability even in a high-temperature environment.

A circuit included in the layer 410A can be formed using a MOS-FET (Metal Oxide Semiconductor-Field Effect Transistor), an LDMOS-FET (Laterally Diffused Metal Oxide Semiconductor-Field Effect Transistor), a bipolar transistor, or the like.

Figure 14:
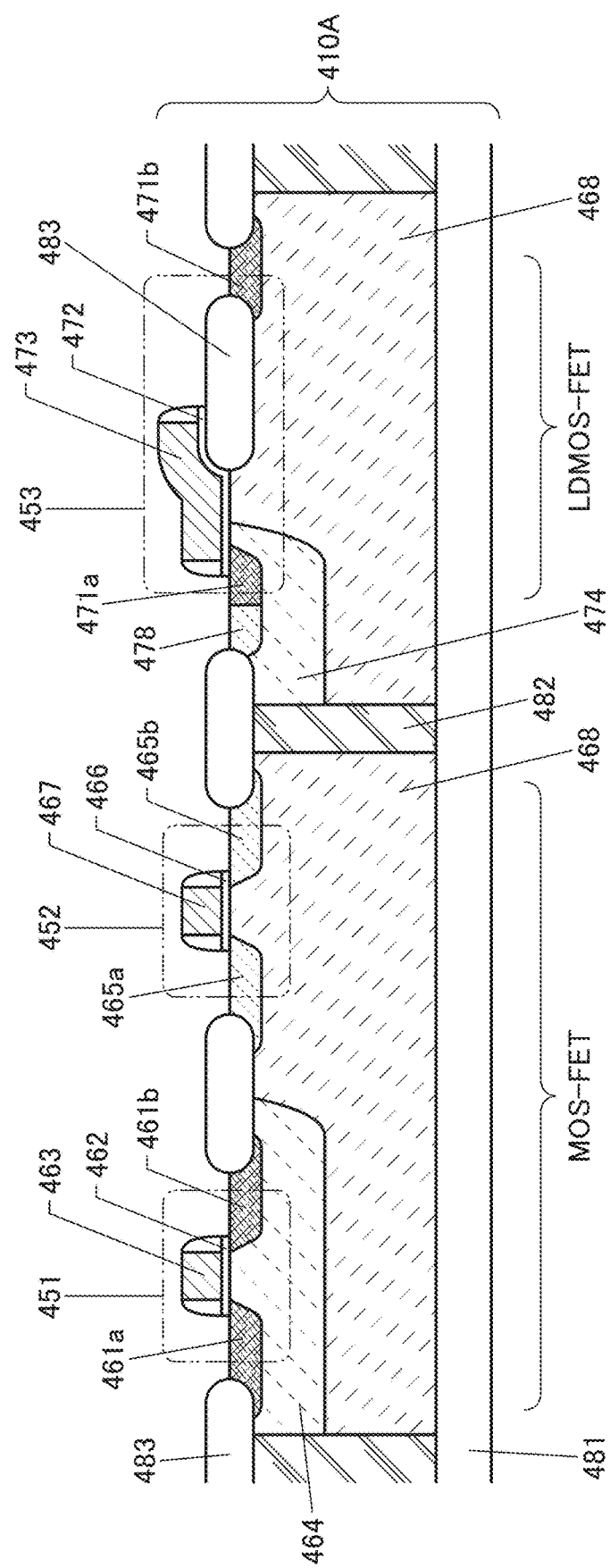
FIG. 14 is a diagram illustrating a cross-sectional structure example of a MOS-FET and an LDMOS-FET.

FIG. 14 illustrates a cross-sectional structure example of a MOS-FET and an LDMOS-FET provided in the layer 410A. A transistor 451 is an n-channel MOS-FET and a transistor 452 is a p-channel MOS-FET. A CMOS (Complementary MOS)-FET can be formed using an re-channel MOS-FET and a p-channel MOS-FET. A transistor 453 is an n-channel LDMOS-FET.

FIG. 14 illustrates an example in which a silicon substrate provided with a buried oxide film 481 (BOX: Buried Oxide) is used in the layer 410A. The layer 410A illustrated in FIG. 14 is formed using an SOI (Silicon On Insulator) substrate using an n-type semiconductor substrate.

The transistor 451, the transistor 452, and the transistor 453 are electrically separated from each other by the buried oxide film 481, an element isolation region 483, and an insulating layer 482. The element isolation region 483 may be formed by a LOCOS (Local Oxidation of Silicon) method, for example. The insulating layer 482 may be formed by a DTI (Deep Trench Isolation) method.

The transistor 451 includes a high concentration n-type impurity region 461a, a high concentration n-type impurity region 461b, an insulating layer 462, and an electrode 463. A channel formation region of the transistor 451 is formed in part of a p-well 464. The transistor 452 includes a high concentration p-type impurity region 465a, a high concentration p-type impurity region 465b, an insulating layer 466, and an electrode 467. A channel formation region of the transistor 452 is formed in part of an n-well 468.

The transistor 453 includes a high concentration n-type impurity region 471a, a high concentration n-type impurity region 471b, an insulating layer 472, and an electrode 473. The insulating layer 472 and the electrode 473 each include a region overlapping with part of the element isolation region 483. A channel formation region of the transistor 453 is formed in part of a p-well 474 and in part of the n-well 468. A high concentration p-type impurity region 478 is provided in adjacent to the high concentration n-type impurity region 471a.

An LDMOS-FET has a structure in which an avalanje breakdown is less likely to occur even when a high voltage is applied. Thus, an LDMOS-FET can be favorably used for the power amplifier 911 in the wireless transceiver 900, for example.

An insulating layer, a conductive layer, or the like may be provided above the transistor 451, the transistor 452, and the transistor 453.

Modification Example 2

Figure 15A:
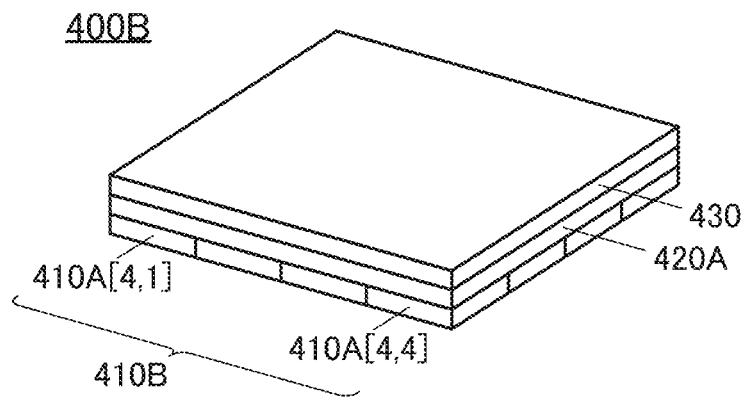
FIG. 15A is a perspective view of a semiconductor device 400B.

FIG. 15A illustrates a perspective view of a semiconductor device 400B. The semiconductor device 400B is a modification example of the semiconductor device 400A. Accordingly, in order to avoid repeated description, differences of the semiconductor device 400B from the semiconductor device 400A are mainly described. The semiconductor device 400B includes a layer 410B instead of the layer 410A in the semiconductor device 400A.

Figure 15B:
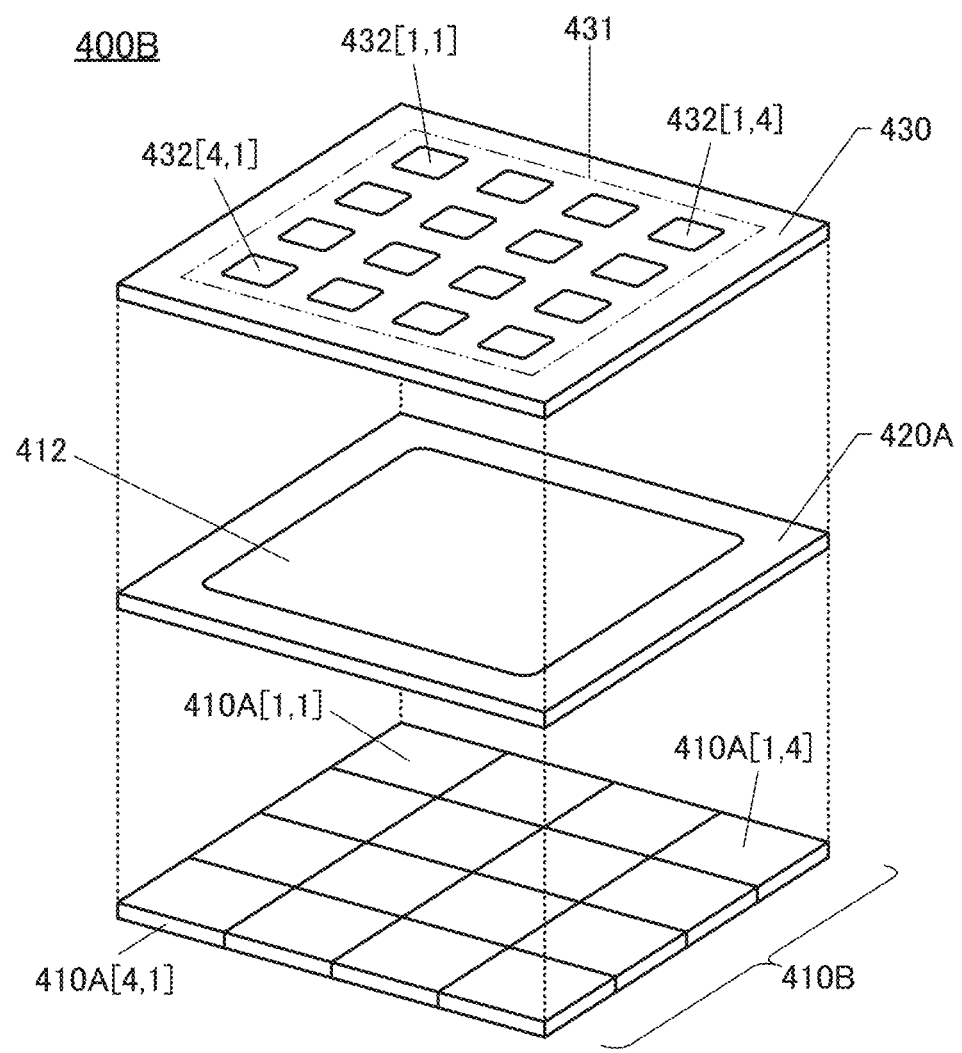
FIG. 15B is a perspective view illustrating a structure of the semiconductor device 400B.

FIG. 15B is a perspective view for illustrating a structure of the semiconductor device 400B. The layer 410B includes a plurality of layers 410A. For example, the layer 410B includes the layers 410A arranged in a matrix of four rows and four columns. In FIG. 15A and/or FIG. 15B, the layer 410A placed in a first row and a first column is denoted by a layer 410A[1,1], the layer 410A placed in a fourth row and the first column is denoted by a layer 410A[4,1], the layer 410A placed in the first row and a fourth column is denoted by a layer 410A[1,4], and the layer 410A placed in the fourth row and the fourth column is denoted by a layer 410A[4,4].

In FIG. 15B, the antenna 432 placed in the first row and the first column is denoted by an antenna 432[1,1], the antenna 432 placed in the fourth row and the first column is denoted by an antenna 432[4,1], and the antenna 432 placed in the first row and the fourth column is denoted by an antenna 432[1,4].

For example, the antenna 432[1,1] is electrically connected to the layer 410A[1,1] and the antenna 432[4,1] is electrically connected to the layer 410A[4,1]. One antenna 432 and one layer 410A are electrically connected to each other, whereby the processing speed of a received signal can be increased.

Modification Example 3

Figure 16A:
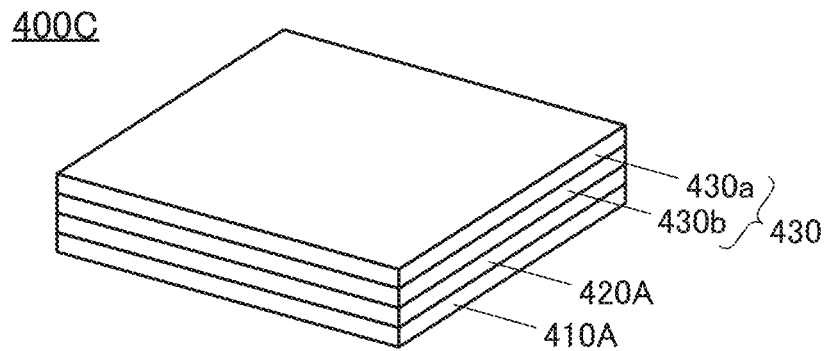
FIG. 16A is a perspective view of a semiconductor device 400C.

FIG. 16A illustrates a perspective view of a semiconductor device 400C. The semiconductor device 400C is a modification example of the semiconductor device 400A. Accordingly, in order to avoid repeated description, differences of the semiconductor device 400C from the semiconductor device 400A are mainly described. In the semiconductor device 400C, the layer 430 includes a layer 430a and a layer 430b. The layer 430a and the layer 430b can be provided to overlap with each other.

Figure 16B:
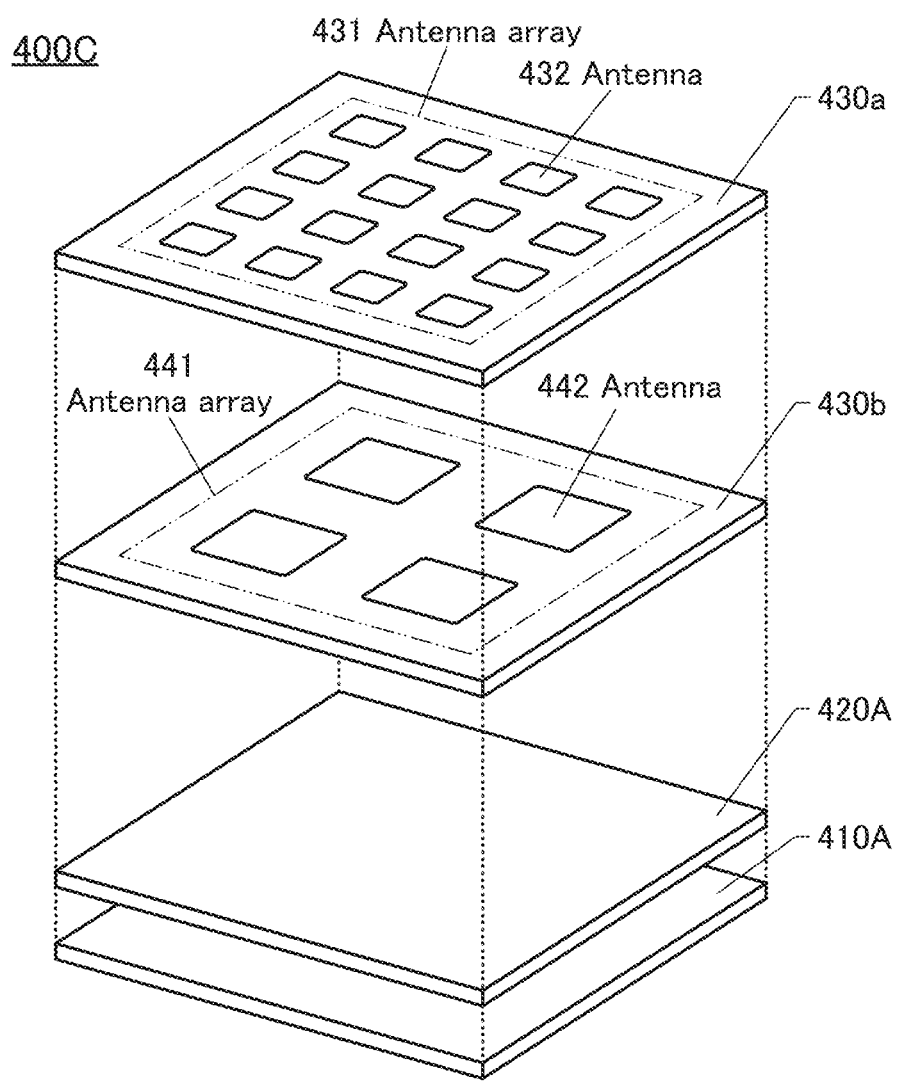
FIG. 16B is a perspective view illustrating a structure of the semiconductor device 400C.

FIG. 16B is a perspective view illustrating a structure of the semiconductor device 400C. The layer 430a includes the antenna array 431. The antenna array 431 includes a plurality of antennas 432. In the semiconductor device 400C, the antennas 432 are arranged in a matrix of four rows and four columns.

The layer 430b includes an antenna array 441. The antenna array 441 includes a plurality of antennas 442. In the semiconductor device 400C, the antennas 442 are arranged in a matrix of two rows and two columns.

The pitch of the antennas 432 arranged in a matrix is preferably different from the pitch of the antennas 442 arranged in a matrix. In addition, the size of the antennas 432 is preferably different from the size of the antennas 442. In the case where the layer 430a is provided over the layer 430b, the antennas 432 are preferably smaller than the antennas 442.

When antennas whose sizes are different from each other are stacked at different pitches, an increase in the area occupied by the antennas can be inhibited and transmission and/or reception of radio waves having different frequencies can be achieved. The antennas 432 and antennas 442 correspond to the antennas 931 described in the other embodiments, for example.

The composition, structure, method, and the like described above in this embodiment can be used in combination as appropriate with the compositions, structures, methods, and the like described in the other embodiments and the example.

Embodiment 4

In this embodiment, structures of transistors that can be used in the semiconductor device described in the above embodiments are described. As an example, a structure in which transistors having different electrical characteristics are stacked is described. With the structure, the degree of freedom in design of the semiconductor device can be increased. Stacking transistors having different electrical characteristics can increase the degree of integration of the semiconductor device.

Figure 17:
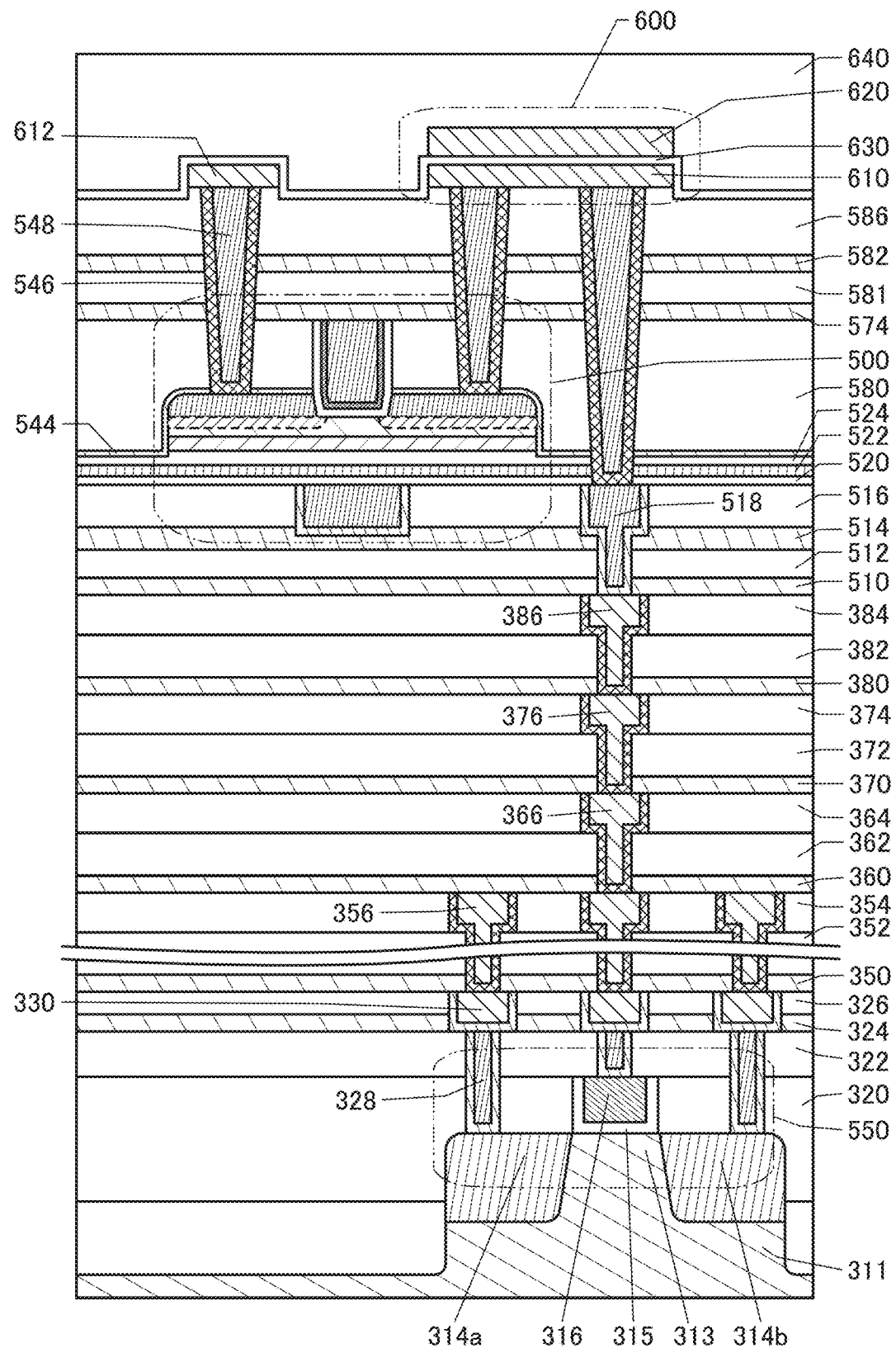
FIG. 17 is a diagram illustrating a structure example of a semiconductor device.
Figure 19A:
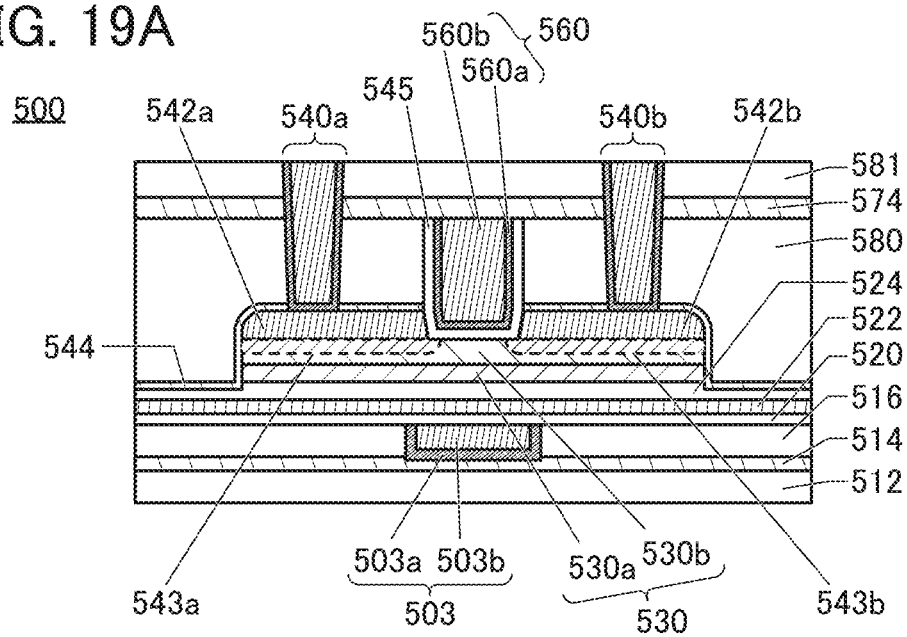
FIG. 19A to FIG. 19C are diagrams illustrating a structure example of a transistor.
Figure 19B:
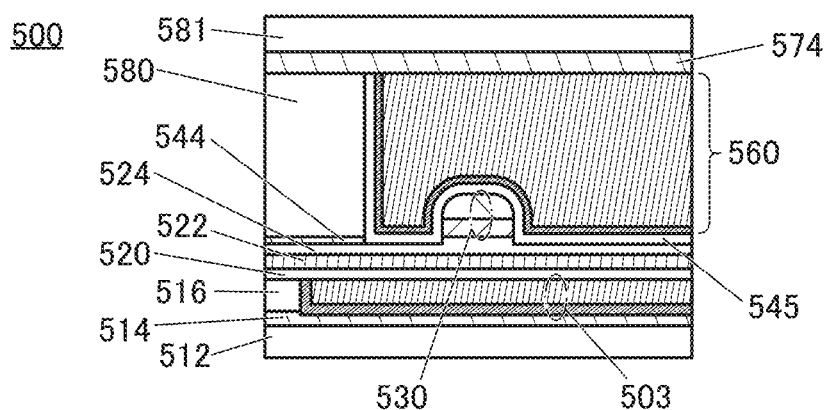
Figure 19C:
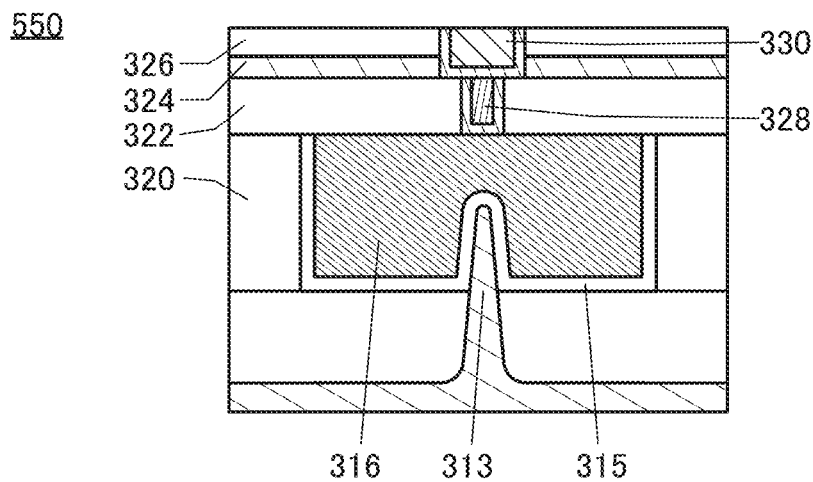

FIG. 17 illustrates part of a cross-sectional structure of a semiconductor device. A semiconductor device illustrated in FIG. 17 includes a transistor 550, a transistor 500, and a capacitor 600. FIG. 19A is a cross-sectional view of the transistor 500 in the channel length direction, FIG. 19B is a cross-sectional view of the transistor 500 in the channel width direction, and FIG. 19C is a cross-sectional view of the transistor 550 in the channel width direction. For example, the transistor 500 and the transistor 550 correspond to the transistor 112 and the transistor 102, respectively, described in the above embodiments. The capacitor 600 corresponds to the capacitor 113.

The transistor 500 is an OS transistor. The transistor 500 has an extremely low off-state current. Accordingly, data voltage or charge written to a storage node through the transistor 500 can be retained for a long time. In other words, power consumption of the semiconductor device can be reduced because a storage node has a low frequency of refresh operation or requires no refresh operation.

In FIG. 17, the transistor 500 is provided above the transistor 550, and the capacitor 600 is provided above the transistor 550 and the transistor 500.

The transistor 550 is provided over a substrate 311 and includes a conductor 316, an insulator 315, a semiconductor region 313 that is part of the substrate 311, and a low-resistance region 314a and a low-resistance region 314b each functioning as a source region or a drain region.

As illustrated in FIG. 19C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (silicon on insulator) substrate, for example.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer); or the like. A transistor formed using a single crystal substrate contains a single crystal semiconductor in a channel formation region.

Figure 18:
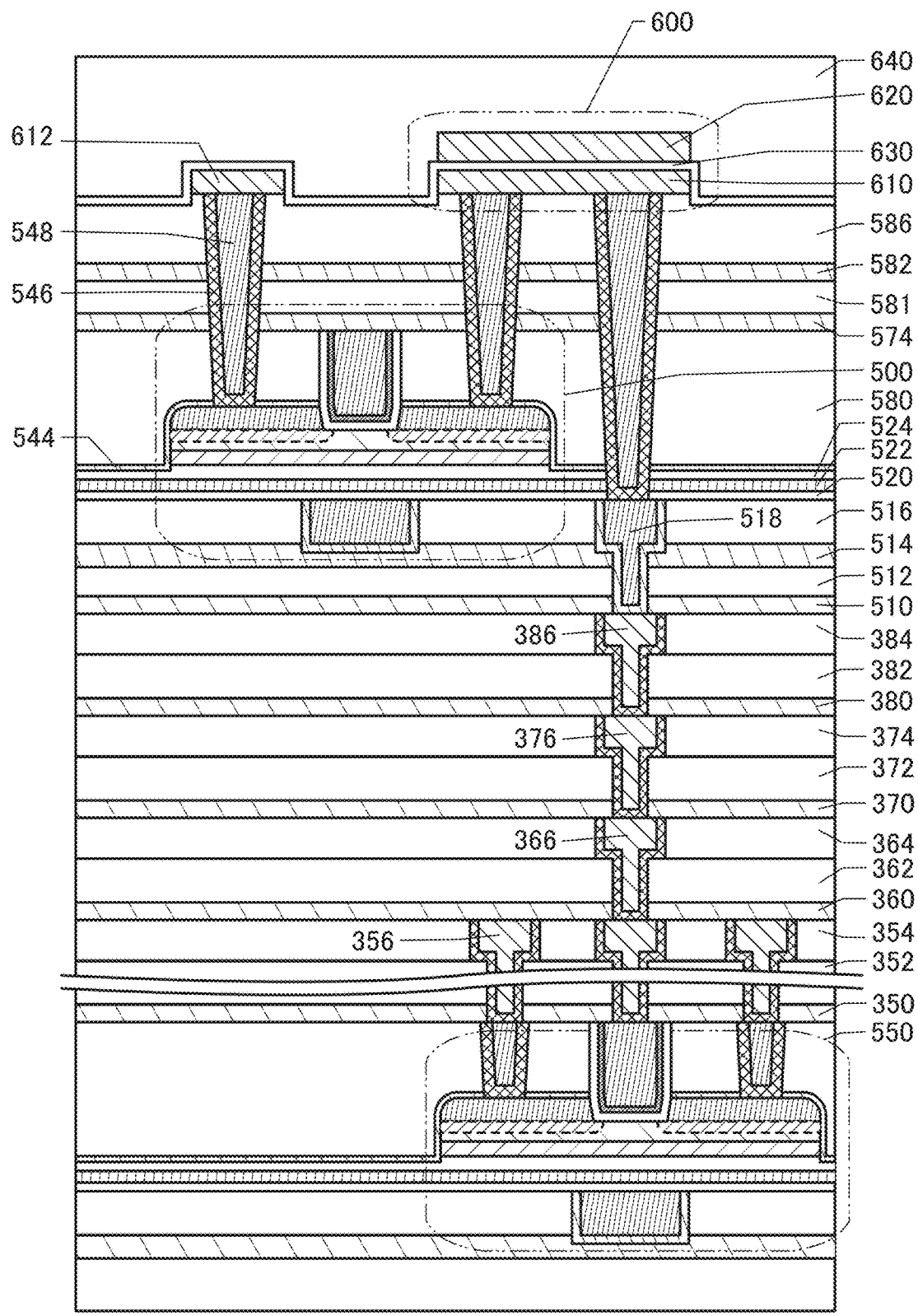
FIG. 18 is a diagram illustrating a structure example of a semiconductor device.

Note that the transistor 550 illustrated in FIG. 17 is an example and the structure is not limited thereto; an appropriate transistor can be used in accordance with a circuit configuration or a driving method. For example, when the semiconductor device is a single-polarity circuit using only OS transistors (which represent transistors having the same polarity, e.g., only n-channel transistors), the transistor 550 has a structure similar to that of the transistor 500 as illustrated in FIG. 18. Note that the details of the transistor 500 are described later.

An insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like can be used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed using a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 17, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 17, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 17, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 17, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property against hydrogen or impurities diffused from the substrate 311, a region where the transistor 550 is provided, or the like into the region where the transistor 500 is provided. Thus, a material similar to that for the insulator 324 can be used.

For the film having a barrier property against hydrogen, silicon nitride formed using a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 19A and FIG. 19B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530$a$ positioned over the insulator 524; an oxide 530$b$ positioned over the oxide 530$a$; a conductor 542$a$ and a conductor 542$b$ positioned apart from each other over the oxide 530$b$; an insulator 580 that is positioned over the conductor 542$a$ and the conductor 542$b$ and is provided with an opening formed to overlap with a region between the conductor 542$a$ and the conductor 542$b$; an insulator 545 positioned on a bottom surface and a side surface of the opening; and a conductor 560 positioned on a formation surface of the insulator 545.

In addition, as illustrated in FIG. 19A and FIG. 19B, an insulator 544 is preferably positioned between the insulator 580 and the oxide 530$a$, the oxide 530$b$, the conductor 542$a$, and the conductor 542$b$. Furthermore, as illustrated in FIG. 19A and FIG. 19B, the conductor 560 preferably includes a conductor 560$a$ provided inside the insulator 545 and a conductor 560$b$ provided to be embedded inside the conductor 560$a$. Moreover, as illustrated in FIG. 19A and FIG. 19B, an insulator 574 is preferably positioned over the insulator 580, the conductor 560, and the insulator 545.

Note that in this specification and the like, the oxide 530$a$ and the oxide 530$b$ are sometimes collectively referred to as an oxide 530.

Note that although a structure of the transistor 500 in which two layers of the oxide 530$a$ and the oxide 530$b$ are stacked in a region where a channel is formed and its vicinity is illustrated, the present invention is not limited thereto. For example, it is possible to employ a structure in which a single layer of the oxide 530$b$ or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistors 500 illustrated in FIG. 17, FIG. 18, and FIG. 19A are examples, and the structures are not limited thereto; an appropriate transistor can be used in accordance with a circuit configuration, a driving method, or the like.

Here, the conductor 560 functions as a gate electrode of the transistor, and the conductor 542$a$ and the conductor 542$b$ each function as a source electrode or a drain electrode. As described above, the conductor 560 is formed to be embedded in the opening of the insulator 580 and the region between the conductor 542$a$ and the conductor 542$b$. The positions of the conductor 560, the conductor 542$a$, and the conductor 542$b$ with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542$a$ and the conductor 542$b$ in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as a top gate) electrode. In addition, the conductor 503 sometimes functions as a second gate (also referred to as a bottom gate) electrode. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture or hydrogen in an oxide semiconductor (sometimes referred to as "dehydration" or "dehydrogenation treatment") and to compensate for oxygen vacancies by supplying oxygen to the oxide semiconductor (sometimes referred to as "oxygen adding treatment") in order to obtain an oxide semiconductor whose $V_OH$ is sufficiently reduced. When an oxide semiconductor with sufficiently reduced impurities such as $V_OH$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \rightarrow V_O+H$" occurs. Part of hydrogen generated at this time is bonded to oxygen to be H$_2$O, and removed from the oxide 530 or an insulator near the oxide 530 in some cases. Some hydrogen may be gettered into the conductor 542a and/or the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O+O \rightarrow$ null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high dielectric constant.

Note that in the transistor 500 in FIG. 19A and FIG. 19B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

Furthermore, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

In addition, the energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gradually changes at a junction portion of the oxide 530a and the oxide 530b. In other words, the energy level of the conduction band minimum at the junction portion of the oxide 530a and the oxide 530b continuously changes or is continuously connected. To obtain this, the density of defect state in a mixed layer formed at an interface between the oxide 530a and the oxide 530b is preferably made low.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 19A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 19A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 that functions as the first gate electrode and has a two-layer structure is illustrated in FIG. 19A and FIG. 19B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that are described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Modification Example 1 of Transistor

Figure 20A:
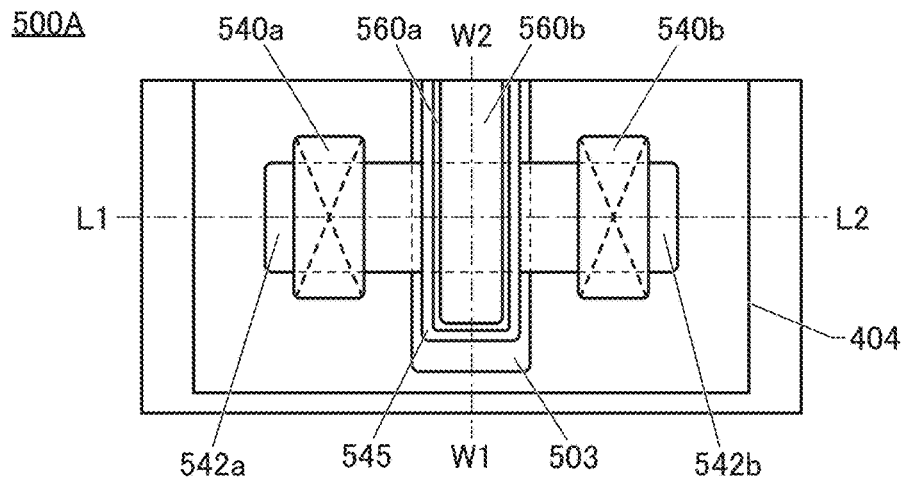
FIG. 20A to FIG. 20C are diagrams illustrating a structure example of a transistor.
Figure 20B:
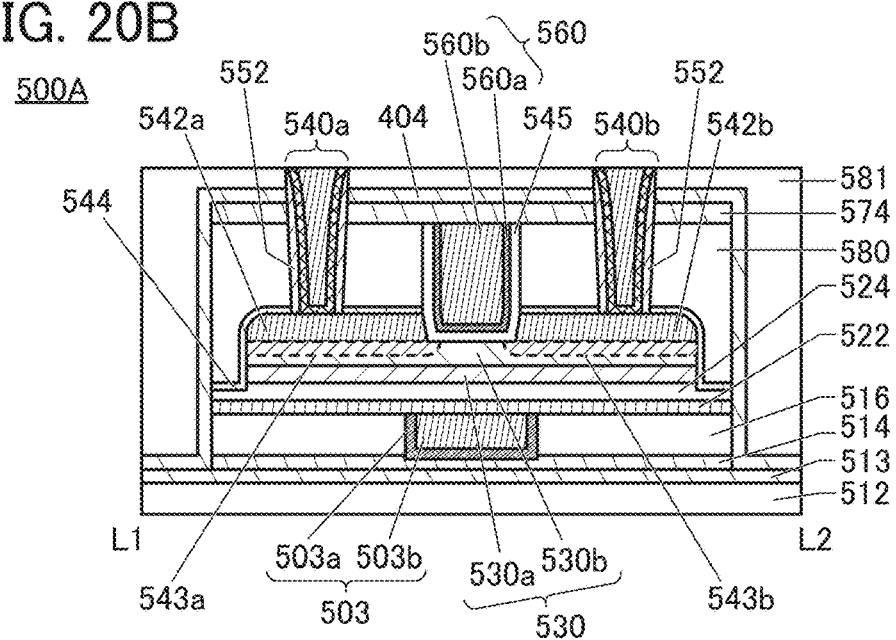
Figure 20C:
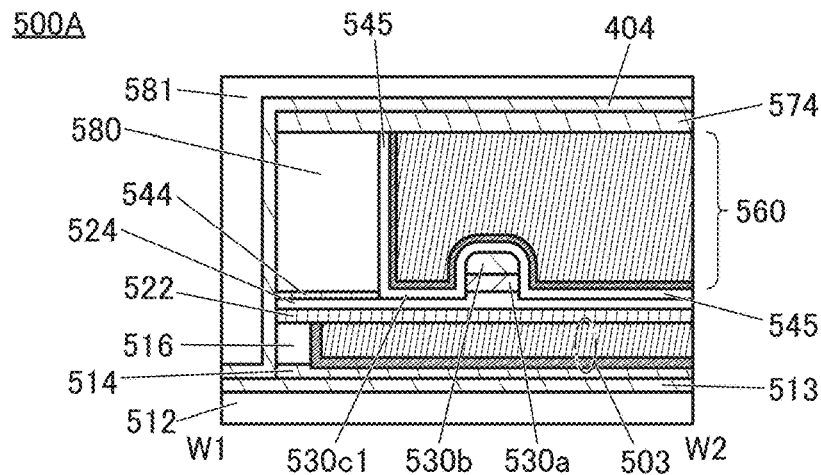

A transistor 500A illustrated in FIG. 20A, FIG. 20B, and FIG. 20C is a modification example of the transistor 500 having the structure illustrated in FIG. 19A and FIG. 19B. FIG. 20A is a top view of the transistor 500A, FIG. 20B is a cross-sectional view of the transistor 500A in the channel length direction, and FIG. 20C is a cross-sectional view of the transistor 500A in the channel width direction. Note that for clarity of the drawing, some components are not illustrated in the top view of FIG. 20A. The structure illustrated in FIG. 20A, FIG. 20B, and FIG. 20C can also be used for other transistors such as the transistor 550 included in the semiconductor device of one embodiment of the present invention.

The transistor 500A having the structure illustrated in FIG. 20A, FIG. 20B, and FIG. 20C is different from the transistor 500 having the structure illustrated in FIG. 19A and FIG. 19B in that an insulator 552, an insulator 513, and an insulator 404 are included. Furthermore, the transistor 500A is different from the transistor 500 having the structure illustrated in FIG. 19A and FIG. 19B in that the insulator 552 is provided in contact with a side surface of the conductor 540a and a side surface of the conductor 540b. Moreover, the transistor 500A is different from the transistor 500 having the structure illustrated in FIG. 19A and FIG. 19B in that the insulator 520 is not included.

In the transistor 500A having the structure illustrated in FIG. 20A, FIG. 20B, and FIG. 20C, the insulator 513 is provided over the insulator 512. The insulator 404 is provided over the insulator 574 and the insulator 513.

In the transistor 500A having the structure illustrated in FIG. 20A, FIG. 20B, and FIG. 20C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Modification Example 2 of Transistor

Figure 21A:
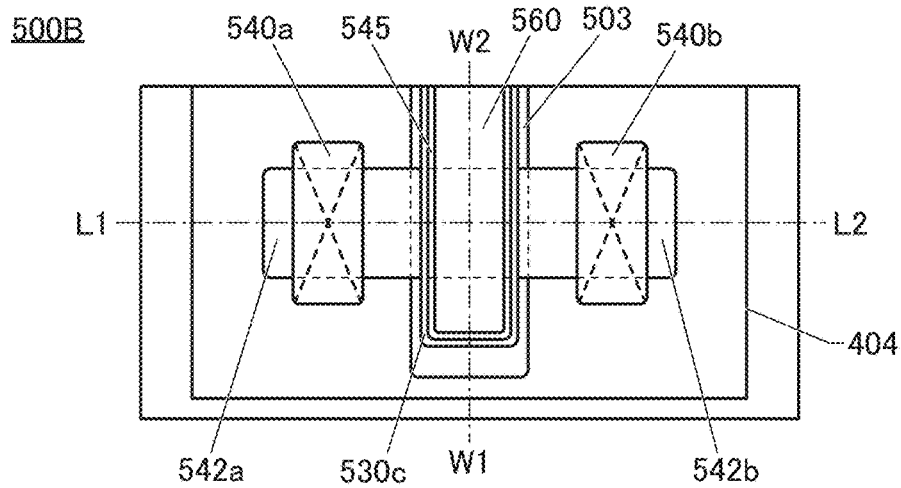
FIG. 21A to FIG. 21C are diagrams illustrating a structure example of a transistor.
Figure 21B:
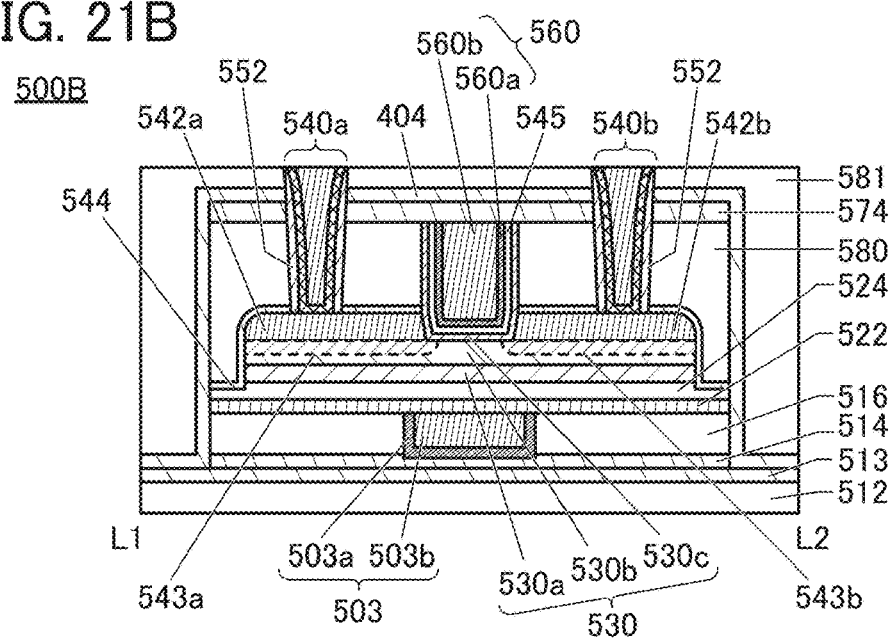
Figure 21C:
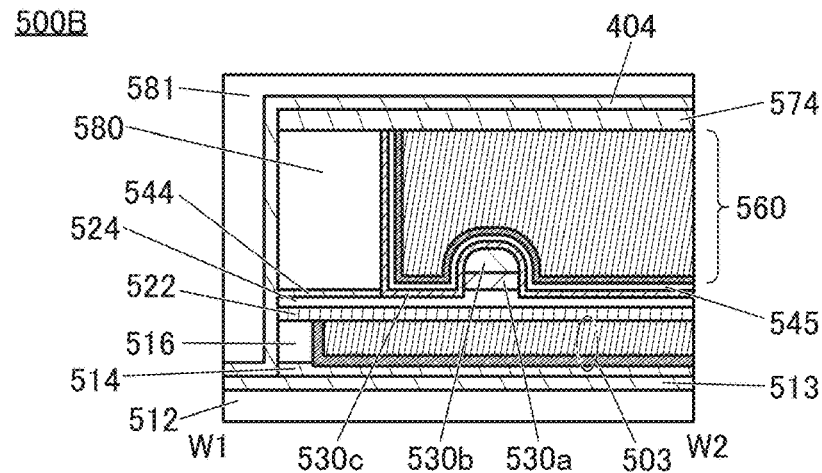

A structure example of a transistor 500B is described with reference to FIG. 21A, FIG. 21B, and FIG. 21C. FIG. 21A is a top view of the transistor 500B. FIG. 21B is a cross-sectional view of a portion indicated by dashed-dotted line L1-L2 in FIG. 21A. FIG. 21C is a cross-sectional view of a portion indicated by dashed-dotted line W1-W2 in FIG. 21A. Note that for clarity of the drawing, some components are not illustrated in the top view of FIG. 21A.

The transistor 500B is a modification example of the transistor 500A and can be replaced with the transistor 500. Accordingly, in order to avoid repeated description, differences of the transistor 500B from the transistor 500A are mainly described.

The transistor 500B is deferent from the transistor 500A in that an oxide 530c is included. Specifically, the transistor 500B includes the insulator 580 that has an opening formed to overlap with a portion between the conductor 542a and the conductor 542b, the oxide 530c positioned on a bottom surface and a side surface of the opening, the insulator 545 positioned on a formation surface of the oxide 530c, and the conductor 560 positioned on the formation surface of the insulator 545.

Note that in this specification and the like, the oxide 530a, the oxide 530b, and the oxide 530c are sometimes collectively referred to as an oxide 530. A metal oxide that can be used as the oxide 530a or the oxide 530b can be used as the oxide 530c.

As described above, the energy of the conduction band minimum of the oxide 530a is preferably higher than the energy of the conduction band minimum of the oxide 530b. Like the oxide 530a, the energy of the conduction band minimum of the oxide 530c is also preferably higher than the energy of the conduction band minimum of the oxide 530b. In other words, the electron affinity of each of the oxide 530a and the oxide 530c is preferably smaller than the electron affinity of the oxide 530b. In this manner, the energy level of the conduction band minimum gently changes at a junction portion of the oxide 530a and the oxide 530b and a junction portion of the oxide 530b and the oxide 530c. A mixed layer with a low density of defect states can be formed at an interface between the oxide 530a and the oxide 530b and an interface between the oxide 530b and the oxide 530c.

The influence of interface scattering on carrier conduction in the transistor 500B including the oxide 530c is smaller than that in the transistor 500 and the transistor 500A. Thus, the transistor 500B can obtain a higher on-state current than the transistor 500 and the transistor 500A.

Moreover, including the oxide 530c over the oxide 530b makes it possible to inhibit diffusion of impurities into the oxide 530b from the components formed above the oxide 530c.

Modification Example 3 of Transistor

Figure 22A:
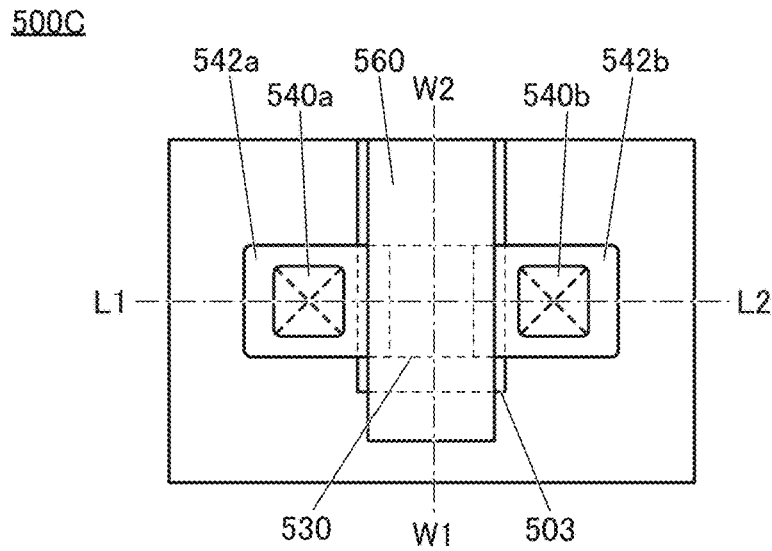
FIG. 22A to FIG. 22C are diagrams illustrating a structure example of a transistor.
Figure 22B:
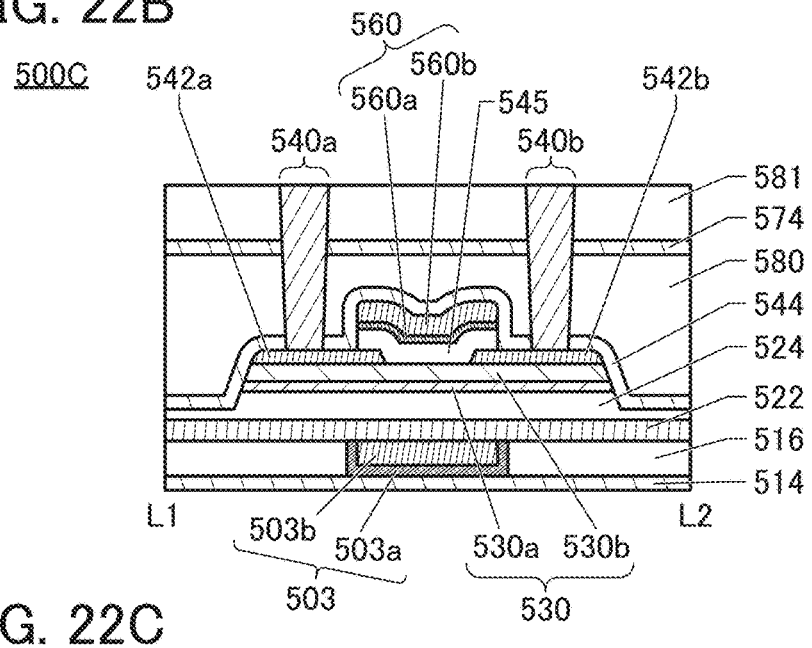
Figure 22C:
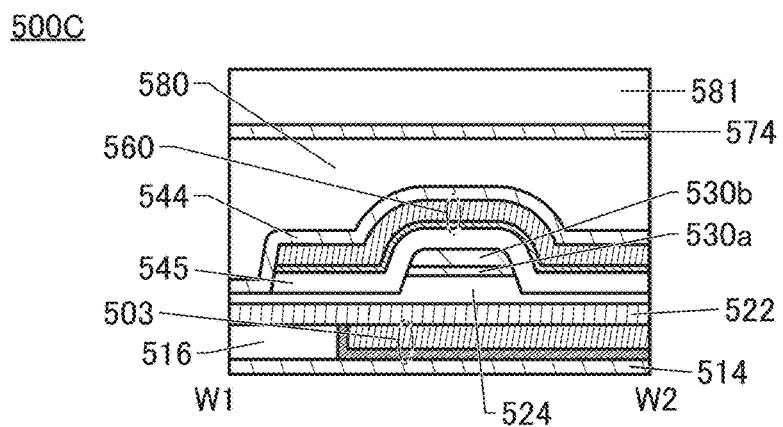

A structure example of a transistor 500C is described with reference to FIG. 22A, FIG. 22B, and FIG. 22C. FIG. 22A is a top view of the transistor 500C. FIG. 22B is a cross-sectional view of a portion indicated by dashed-dotted line L1-L2 in FIG. 22A. FIG. 22C is a cross-sectional view of a portion indicated by dashed-dotted line W1-W2 in FIG. 22A. Note that for clarity of the drawing, some components are not illustrated in the top view of FIG. 22A.

The transistor 500C is a modification example of the transistor 500 and can be replaced with the transistor 500. Accordingly, in order to avoid repeated description, differences of the transistor 500C from the transistor 500 are mainly described.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting diffusion of oxygen, the range of choices for the material of the conductor 560b can be extended. That is, the conductor 560a inhibits oxidation of the conductor 560b, thereby preventing the decrease in conductivity.

The insulator 544 is preferably provided to cover the top surface and a side surface of the conductor 560 and a side surface of the insulator 545. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500C.

The transistor 500C has the conductor 560 overlapping part of the conductor 542a and part of the conductor 542b, and thus tends to have larger parasitic capacitance than the transistor 500. Consequently, the transistor 500C tends to have a lower operating frequency than the transistor 500. However, the transistor 500C does not require steps of providing an opening in the insulator 580 and the like and embedding the conductor 560, the insulator 545, and the like in the opening; hence, the productivity of the transistor 500C is higher than that of the transistor 500.

The composition, structure, method, and the like described in this embodiment can be used in combination as appropriate with the compositions, structures, methods, and the like described in the other embodiments, the example, and the like.

Embodiment 5

In this embodiment, an oxide semiconductor which is a kind of metal oxides is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor is described with reference to FIG. 23A. FIG. 23A is a diagram showing classification of crystal structures of an oxide semiconductor, typically IGZO (a metal oxide containing In, Ga, and Zn).

As shown in FIG. 23A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 23A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. Here, FIG. 23B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 23B and obtained by GIXD measurement is hereinafter simply referred to as an XRD spectrum. The CAAC-IGZO film in FIG. 23B has a composition in the vicinity of In:Ga:Zn=4:2:3[atomic ratio]. The CAAC-IGZO film in FIG. 23B has a thickness of 500 nm.

As shown in FIG. 23B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 23B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 23C shows a diffraction pattern of the CAAC-IGZO film. FIG. 23C shows a diffraction pattern obtained with the NBED method in which an electron beam is incident in the direction parallel to the substrate. The composition of the CAAC-IGZO film in FIG. 23C is In:Ga:Zn=4:2:3 [atomic ratio] or the neighborhood thereof. In the nanobeam electron diffraction method, electron diffraction is performed with a probe diameter of 1 nm.

As shown in FIG. 23C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 23A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In-Ga-Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), a high field-effect mobility (μ) and favorable switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^3$, still further preferably lower than or equal to $1\times10^{11}$ cm$^3$, yet further preferably lower than $1\times10^{10}$ cm$^3$, and higher than or equal to $1\times10^{-9}$ cm$^3$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described in this embodiment can be used in combination as appropriate with the compositions, structures, methods, and the like described in the other embodiments, the example, and the like.

Embodiment 6

In this embodiment, application examples of the above-described semiconductor device are described.

[Semiconductor Wafer and Chip]

Figure 24A:
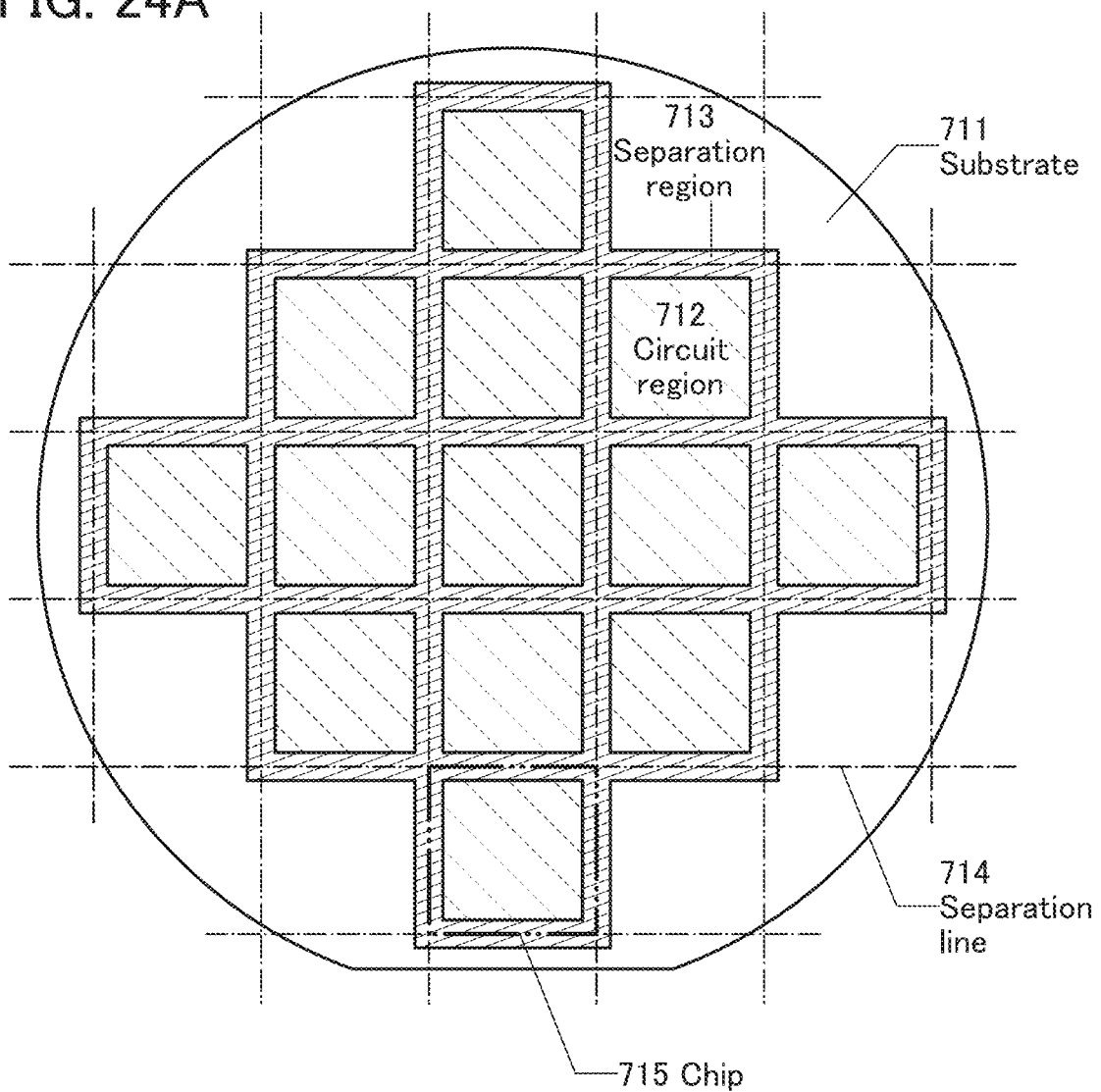
FIG. 24A is a top view of a semiconductor wafer.

FIG. 24A is a top view of a substrate 711 before dicing treatment is performed. As the substrate 711, a semiconductor substrate (also referred to as a "semiconductor wafer") can be used, for example. A plurality of circuit regions 712 are provided over the substrate 711. A semiconductor device, a CPU, an RF tag, an image sensor, or the like of one embodiment of the present invention can be provided in the circuit region 712.

Figure 24B:
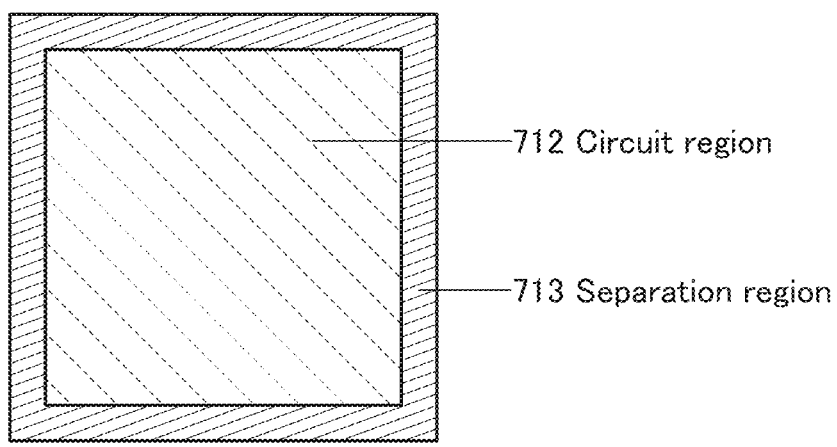
FIG. 24B is a top view of a chip.

The plurality of circuit regions 712 are each surrounded by a separation region 713. Separation lines (also referred to as "dicing lines") 714 are set at a position overlapping with the separation regions 713. The substrate 711 is cut along the separation lines 714, whereby chips 715 including the circuit regions 712 can be cut out from the substrate 711. FIG. 24B illustrates an enlarged view of the chip 715.

Furthermore, a conductive layer or a semiconductor layer may be provided in the separation regions 713. Providing a conductive layer or a semiconductor layer in the separation regions 713 relieves ESD that might be caused in a dicing step, preventing a decrease in the yield in the dicing step. Furthermore, a dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the manufacturing cost of the semiconductor device can be reduced. Furthermore, the productivity of the semiconductor device can be increased.

For a semiconductor layer provided in the separation regions 713, a material having a bandgap greater than or equal to 2.5 eV and less than or equal to 4.2 eV is preferably used and a material having a bandgap greater than or equal to 2.7 eV and less than or equal to 3.5 eV is further preferable. The use of such a material allows accumulated charges to be released slowly; thus, rapid move of charges due to ESD can be suppressed and electrostatic breakdown is less likely to occur.

[Electronic Component]

Figure 25A:
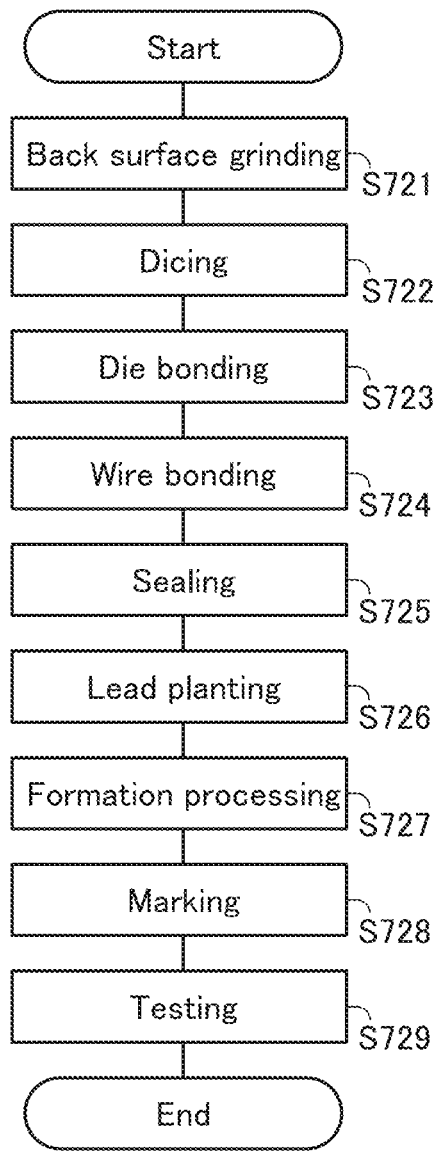
FIG. 25A is a flowchart showing an example of a fabricating process of an electronic component.

An example where the chip 715 is used for an electronic component is described with reference to FIG. 25A and FIG. 25B. Note that the electronic component is also referred to as a semiconductor package or an IC package. For electronic components, there are various standards and names corresponding to a terminal extraction direction and a terminal shape.

The electronic component is completed when the semiconductor device described in the above embodiment is combined with components other than the semiconductor device in an assembly process (post-process).

The post-process is described with reference to a flow chart shown in FIG. 25A. After an element substrate including the semiconductor device described in the above embodiment is completed in a pre-process, a "back surface grinding step" is performed to grind a back surface (a surface where the semiconductor device and the like are not formed) of the element substrate (Step S721). When the element substrate is thinned by grinding, warpage or the like of the element substrate is reduced, so that the size of the electronic component can be reduced.

Next, a "dicing step" for dividing the element substrate into a plurality of chips (the chips 715) is performed (Step S722). Then, a "die bonding step" is performed to pick up the divided chips separately and bond them to a lead frame (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a "wire bonding step" for electrically connecting a lead of the lead frame and an electrode on the chip through a metal fine line (wire) is performed (Step S724). A silver line or a gold line can be used as the metal fine line. Furthermore, ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a "lead plating step" for plating the lead of the lead frame is performed (Step S726). This plating treatment prevents rust of the lead and enables more reliable soldering at the time of mounting the electronic component on a printed board in a later step. Then, a "formation step" for cutting and processing the lead is performed (Step S727).

Next, a "marking step" for printing (marking) a surface of the package is performed (Step S728). Then, after a "testing step" (Step S729) for checking whether an external shape is good and whether there is a malfunction, for example, the electronic component is completed.

Figure 25B:
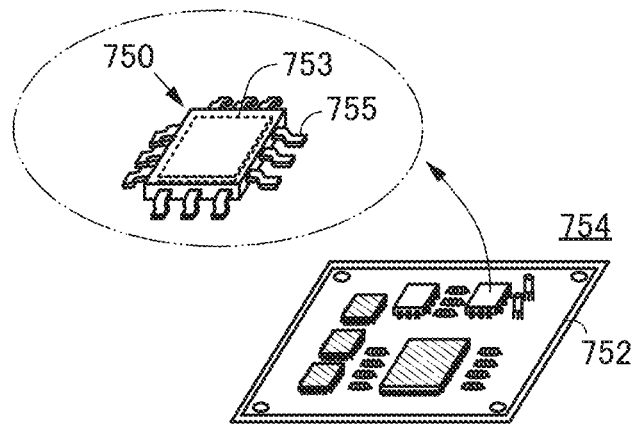
FIG. 25B is a schematic perspective view of the electronic component.

FIG. 25B illustrates a schematic perspective view of the completed electronic component. FIG. 25B illustrates a schematic perspective view of a QFP (Quad Flat Package) as an example of the electronic component. An electronic component 750 illustrated in FIG. 25B includes a lead 755 and a semiconductor device 753. As the semiconductor device 753, the semiconductor device described in the above embodiment or the like can be used.

The electronic component 750 illustrated in FIG. 25B is mounted on a printed circuit board 752, for example. A plurality of such electronic components 750 are combined and electrically connected to each other on the printed circuit board 752; thus, a board on which the electronic components are mounted (a circuit board 754) is completed. The completed circuit board 754 is used for an electronic device or the like.

[Electronic Device]

Next, examples of electronic devices including the semiconductor device of one embodiment of the present invention or the above-described electronic component are described.

Examples of electronic devices including the semiconductor device of one embodiment of the present invention or the electronic component include display devices of televisions, monitors, and the like; lighting devices; desktop personal computers; laptop personal computers; word processors; image reproduction devices that reproduce still images and moving images stored in recording media such as DVDs (digital versatile discs); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Furthermore, industrial equipment such as guide lights, traffic lights, belt conveyors, elevators, escalators, industrial robots, power storage systems, and power storage devices for leveling the amount of power supply and smart grid can be given.

In addition, moving objects and the like driven by electric motors using power from the power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The semiconductor device of one embodiment of the present invention or the electronic component can be used for a communication device or the like in any of the electronic devices.

The electronic device may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, power, radiation, flow rate, humidity, gradient, oscillation, a smell, or infrared rays) and the like.

The electronic device can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 26:
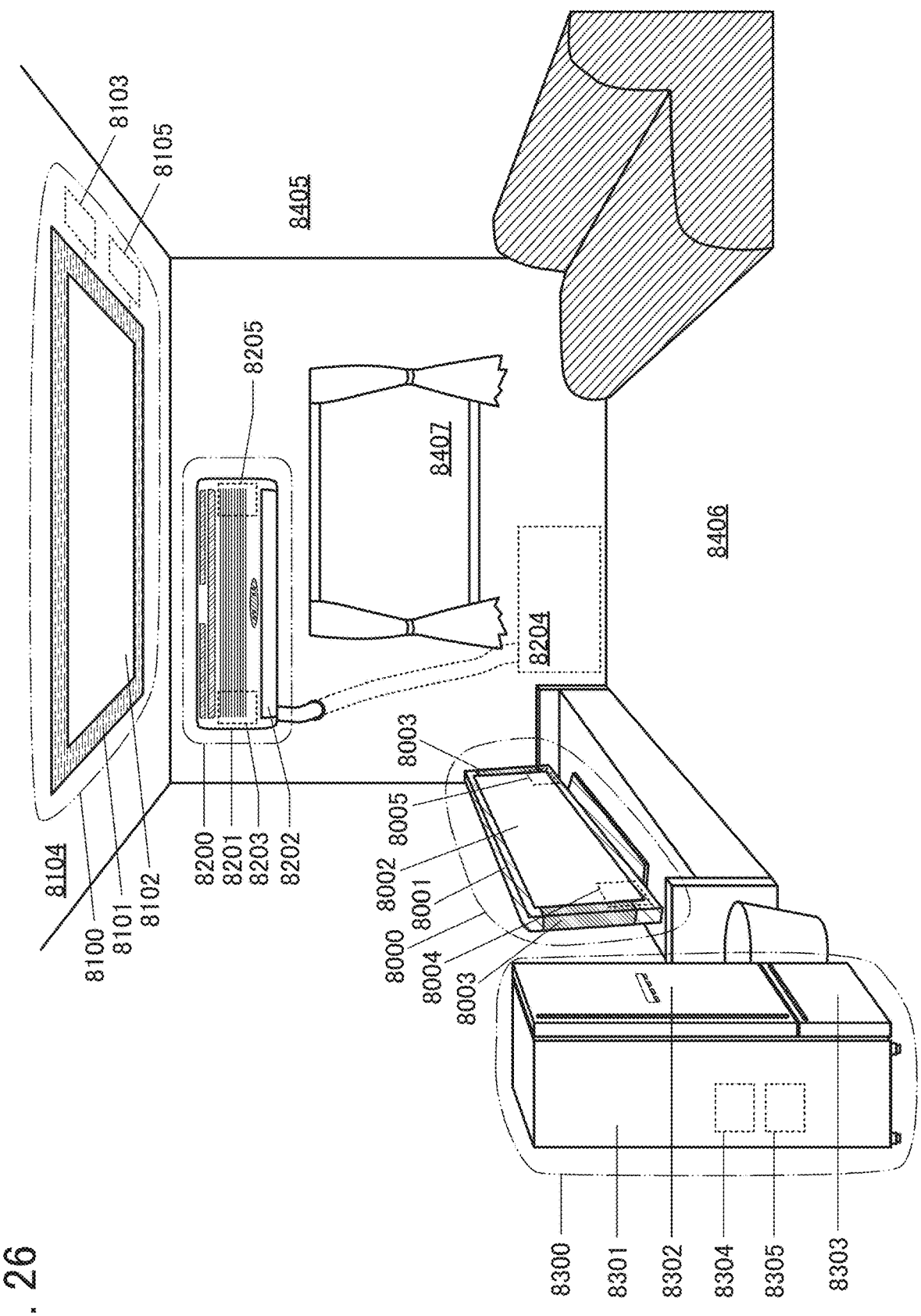
FIG. 26 is a diagram illustrating examples of electronic devices.

FIG. 26 and FIG. 27A to FIG. 27F illustrate examples of electronic devices. In FIG. 26, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. The semiconductor device 8004 can retain control data, a control program, or the like. The semiconductor device 8004 has a communication function, and the display device 8000 can function as an IoT device. The display device 8000 can receive power from a commercial power supply or can use power stored in the power storage device 8005.

A display device such as a liquid crystal display device, a light-emitting display device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

Note that the display device includes, in its category, all of information display devices for personal computers, advertisement display, and the like besides for TV broadcast reception.

In FIG. 26, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 26 illustrates the case where the semiconductor device 8103 is provided in a ceiling 8104 on which the housing 8101 and the light source 8102 are installed, the semiconductor device 8103 may be provided in the housing 8101. The semiconductor device 8103 can retain data such as emission luminance of the light source 8102, a control program, or the like. The semiconductor device 8103 has a communication function, and the lighting device 8100 can function as an IoT device. The display device 8100 can receive power from a commercial power supply or can use power stored in the power storage device.

Note that although the installation lighting device 8100 provided in the ceiling 8104 is illustrated in FIG. 26 as an example, the semiconductor device of one embodiment of the present invention can be used in an installation lighting device provided in, for example, a wall 8405, a floor 8406, a window 8407, or the like other than the ceiling 8104. Alternatively, the semiconductor device of one embodiment of the present invention can be used in a tabletop lighting device or the like.

As the light source 8102, an artificial light source that emits light artificially by using power can be used. Specific examples of the artificial light source include an incandescent lamp, a discharge lamp such as a fluorescent lamp, and light-emitting elements such as an LED and an organic EL element.

In FIG. 26, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 26 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can retain control data, a control program, or the like of the air conditioner. The semiconductor device 8203 has a communication function, and the air conditioner can function as an IoT device. The air conditioner can receive power from a commercial power supply or can use power stored in the power storage device 8205.

Note that although the split-type air conditioner including the indoor unit and the outdoor unit is illustrated in FIG. 26 as an example, the semiconductor device of one embodiment of the present invention can also be used in an air conditioner in which the functions of an indoor unit and an outdoor unit are integrated in one housing.

In FIG. 26, an electric refrigerator-freezer 8300 is an example of an electronic device including a semiconductor device 8304 of one embodiment of the present invention. Specifically, the electric refrigerator-freezer 8300 includes a housing 8301, a refrigerator 8302 door, a freezer door 8303, the semiconductor device 8304, a power storage device 8305, and the like. The power storage device 8305 is provided in the housing 8301 in FIG. 26. The semiconductor device 8304 can retain control data, a control program, or the like of the electric refrigerator-freezer 8300. The semiconductor device 8304 has a communication function, and the electric refrigerator-freezer 8300 can function as an IoT device. The electric refrigerator-freezer 8300 can receive power from a commercial power supply or can use power stored in the power storage device 8305.

Figure 27A:
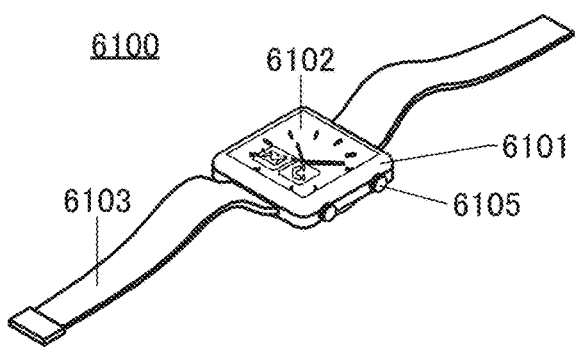
FIG. 27A to FIG. 27F are diagrams illustrating examples of electronic devices.

FIG. 27A illustrates an example of a wrist-watch-type portable information terminal. A portable information terminal 6100 includes a housing 6101, a display portion 6102, a band 6103, operation buttons 6105, and the like. The portable information terminal 6100 further includes a secondary battery and the semiconductor device of one embodiment of the present invention or the electronic component. The portable information terminal 6100 including the semiconductor device of one embodiment of the present invention or the electronic component can function as an IoT device.

Figure 27B:
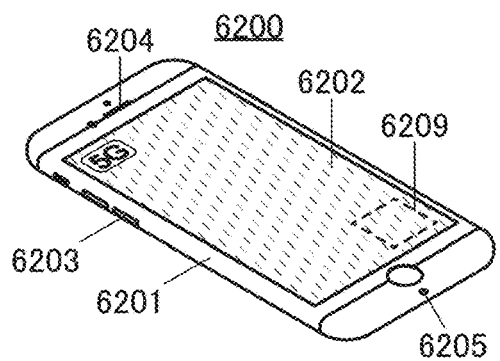

FIG. 27B illustrates an example of a mobile phone. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device of one embodiment of the present invention or the electronic component. The portable information terminal 6200 including the semiconductor device of one embodiment of the present invention or the electronic component can function as an IoT device.

Figure 27C:
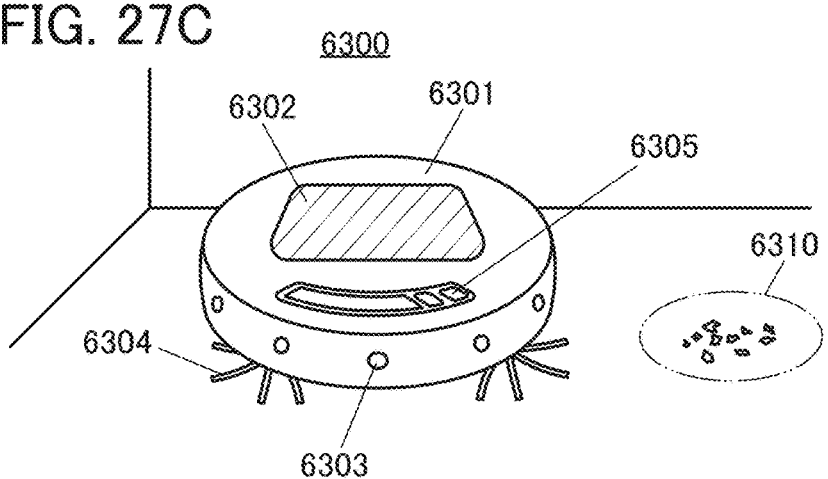

FIG. 27C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not illustrated, the cleaning robot 6300 is provided with a tire, an inlet, and the like. The cleaning robot 6300 can run autonomously, detect dust 6310, and vacuum the dust through the inlet provided on the bottom surface.

For example, the cleaning robot 6300 can analyze images taken by the cameras 6303 to judge whether there are obstacles such as a wall, furniture, or a step. In the case where an object that is likely to be caught in the brush 6304, such as a wire, is detected by image analysis, the rotation of the brush 6304 can be stopped. The cleaning robot 6300 includes a secondary battery and the semiconductor device of one embodiment of the present invention or the electronic component. The cleaning robot 6300 including the semiconductor device of one embodiment of the present invention or the electronic component can function as an IoT device.

Figure 27D:
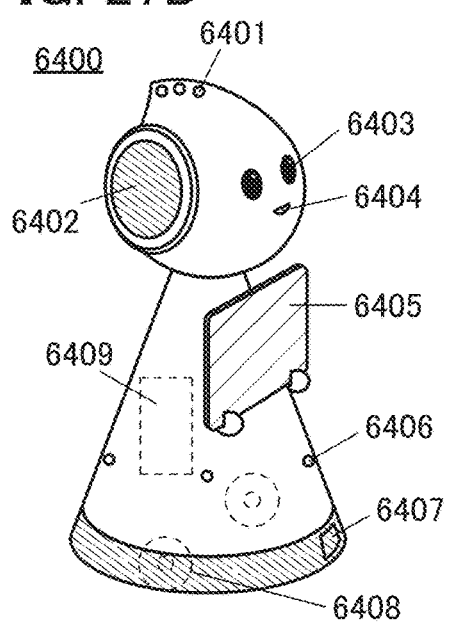

FIG. 27D illustrates an example of a robot. A robot 6400 illustrated in FIG. 27D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 also has a function of outputting sound. The robot 6400 can communicate with a user using the microphone 6402 and the speaker 6404.

The display portion 6405 has a function of displaying various kinds of information. The robot 6400 can display user's desired information on the display portion 6405. A touch panel may be incorporated in the display portion 6405. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect the presence of an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting device of one embodiment of the present invention can be used for the display portion 6405.

The robot 6400 includes a secondary battery and the semiconductor device of one embodiment of the present invention or the electronic component. The robot 6400 including the semiconductor device of one embodiment of the present invention or the electronic component can function as an IoT device.

Figure 27E:
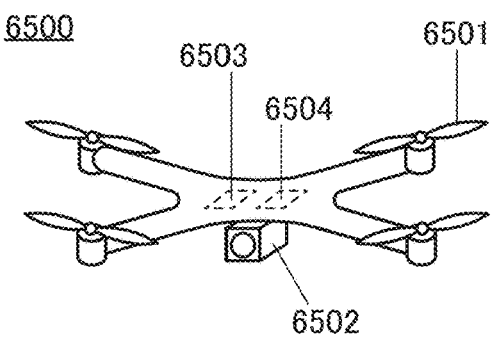

FIG. 27E illustrates an example of a flying object. A flying object 6500 illustrated in FIG. 27E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there is an obstacle in the way of the movement. Moreover, the electronic component 6504 can estimate the remaining battery level from a change in the power storage capacity of the battery 6503. The flying object 6500 further includes the semiconductor device of one embodiment of the present invention or the electronic component. The flying object 6500 including the semiconductor device of one embodiment of the present invention or the electronic component can function as an IoT device.

Figure 27F:
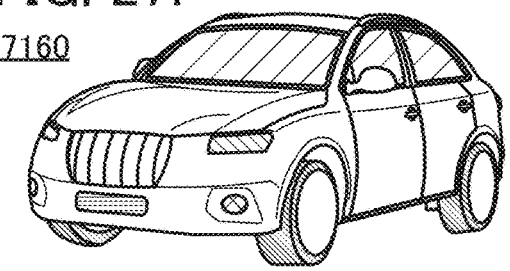

FIG. 27F illustrates an example of an automobile. An automobile 7160 includes an engine, tires, a brake, a steering gear, a camera, and the like. The automobile 7160 includes the semiconductor device of one embodiment of the present invention or the electronic component. The automobile 7160 including the semiconductor device of one embodiment of the present invention or the electronic component can function as an IoT device.

The composition, structure, method, and the like described in this example can be used in combination as appropriate with the compositions, structures, methods, and the like described in the other embodiments and the example.

Embodiment 7

A normally-off CPU (also referred to as "Noff-CPU") can be achieved by using the OS transistor described in this specification and the like. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in operation speed.

The Noff-CPU can be suitably used for a small-scale system such as an IoT end device (also referred to as an "endpoint microcomputer") 803 in the IoT (Internet of Things) field, for example.

Figure 28:
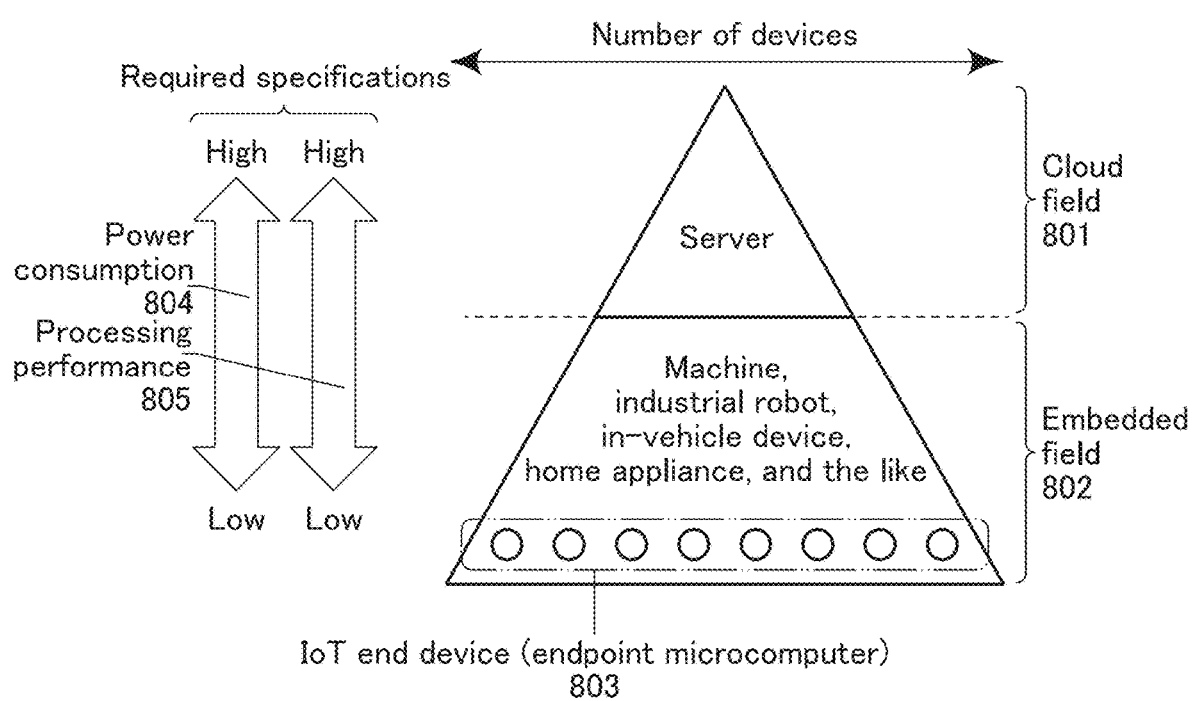
FIG. 28 is a diagram illustrating a hierarchical structure of an IoT network and tendencies of required specifications.

FIG. 28 illustrates a hierarchical structure of an IoT network and tendencies of required specifications. FIG. 28 illustrates power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption towards the top of the hierarchical structure. Thus, a high-performance CPU, a high-performance GPU, a large-scale SoC (System on a Chip), and the like are used in the cloud field 801. Furthermore, lower power consumption is required rather than higher processing performance towards the bottom of the hierarchical structure, and the number of devices is explosively increased. The semiconductor device of one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 29:
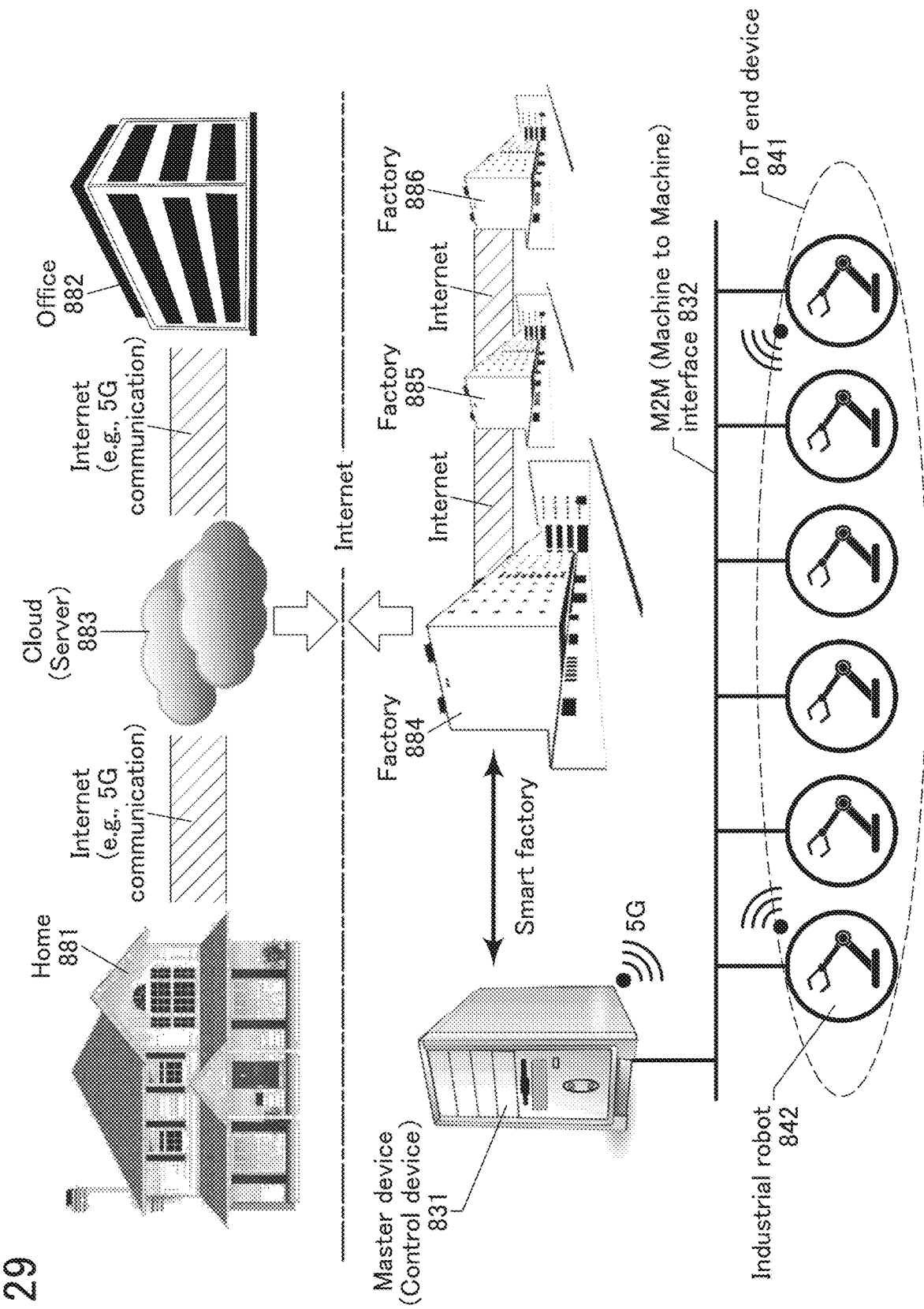
FIG. 29 is a conceptual diagram of factory automation.

FIG. 29 shows a conceptual diagram showing factory automation as an application example of the endpoint microcomputer. A factory 884 is connected to a cloud 883 through Internet connection (Internet). The cloud 883 is connected to a home 881 and an office 882 through the Internet connection. The Internet connection may be wired communication or wireless communication. In the case of wireless communication, for example, wireless communication based on a communication standard such as the fourth-generation mobile communications system (4G) or the fifth-generation mobile communications system (5G) is performed using the semiconductor device of one embodiment of the present invention for a communication device. The factory 884 may be connected to a factory 885 and a factory 886 through the Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet (Ethernet is a registered trademark), which is a kind of wired communication, or local 5G, which is a kind of wireless communication, may be used.

A factory manager can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; this situation is called "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby operation by the Noff-CPU. Meanwhile, the embedded field of IoT sometimes requires quick response; the use of the Noff-CPU achieves high-speed return from a standby operation.

The composition, structure, method, and the like described in this embodiment can be used in combination as appropriate with the compositions, structures, methods, and the like described in the other embodiments, the example, and the like.

Example

In this example, the simulation results of the cutoff frequency of an OS-FET that can be used for the present invention are described.

The cutoff frequency ($f_T$) of the OS-FET can be obtained by Formula 3 below.

[Formula 3]

$$f_T = \frac{g_m}{2\pi C_g} \quad (3)$$

Here, $C_g$ and $g_m$ denote the gate capacitance and transconductance of the OS-FET, respectively. The transconductance $g_m$ at a particular drain voltage can be obtained by Formula 4 below.

[Formula 4]

$$g_m = \left(\frac{\partial I_d}{\partial V_g}\right)_{V_d} \quad (4)$$

In Formula 4 above, $V_g$, $I_d$, and $V_d$ are the gate voltage, the drain current, and the drain voltage of the OS-FET, respectively.

Figure 30A:
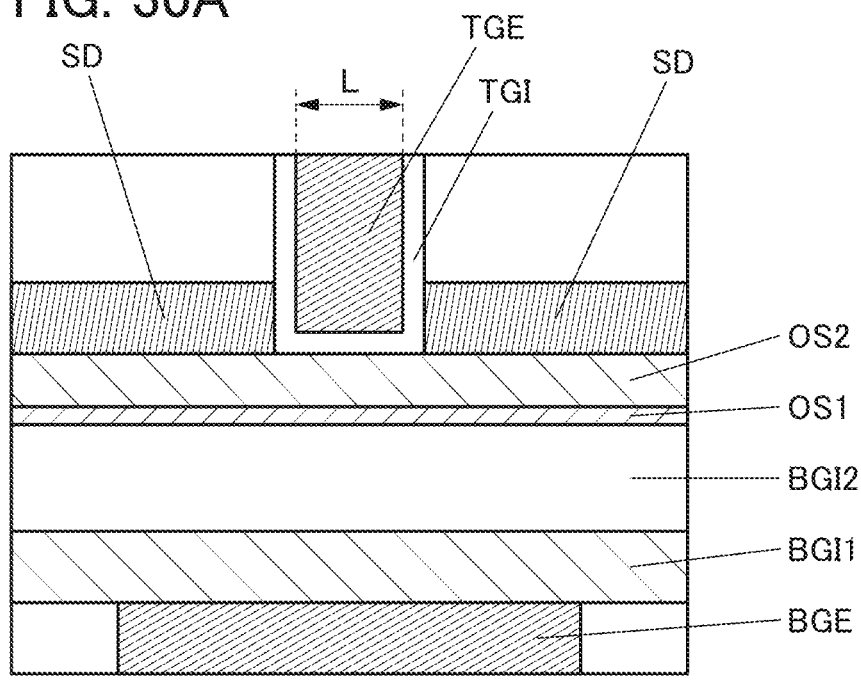
FIG. 30A to FIG. 30C are diagrams illustrating a structure of an OS-FET used for calculation of the cutoff frequency.
Figure 30B:
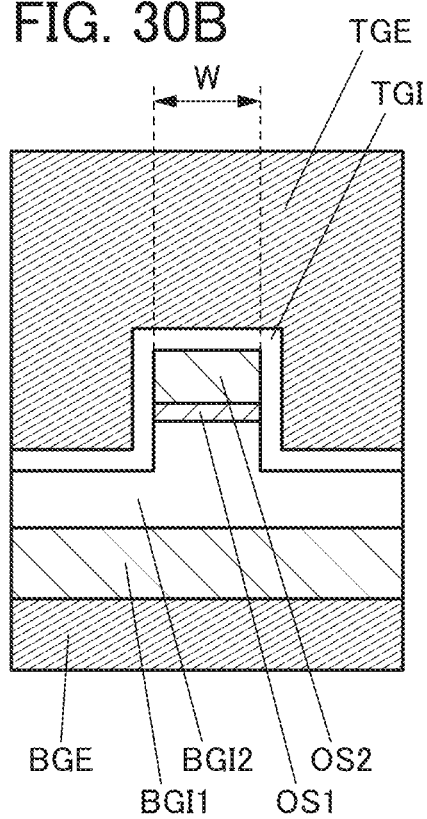
Figure 30C:
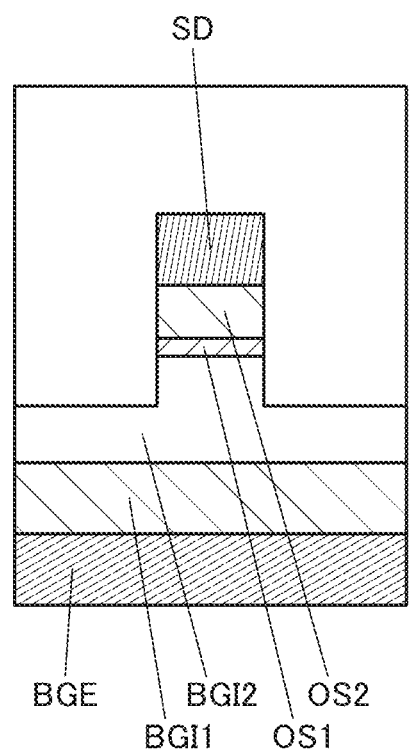

For the calculation of the cutoff frequency, Atlas 3D, a device simulator from Silvaco Inc., was used. FIG. 30A to FIG. 30C illustrate a structure of the OS-FET used for the calculation. FIG. 30A is a schematic cross-sectional view of a center portion of the channel of the OS-FET in the channel length direction. FIG. 30B is a schematic cross-sectional view of the center portion of the channel of the OS-FET in the channel width direction. FIG. 30C is a schematic cross-sectional view of the source region or the drain region of the OS-FET in the channel width direction.

In FIG. 30A to FIG. 30C, the OS-FET includes BGE, BGI1, BGI2, OS1, OS2, a pair of SDs, TGI, and TGE. BGE functions as a back gate electrode and TGE functions as a gate electrode (also referred to as a top-gate electrode). OS1 and OS2 are a metal oxide having a stacked-layer structure. The pair of SDs each function as a source electrode and a drain electrode. BGI1 and BGI2 function as a gate insulating film having a stacked-layer structure that is provided between BGE and OS1, and TGI functions as a gate insulating film provided between OS2 and TGE.

As OS1, a metal oxide of In:Ga:Zn=1:3:4 [atomic ratio] was used. As OS2, a metal oxide of In:Ga:Zn=4:2:3 [atomic ratio] was used.

Furthermore, L in FIG. 30A, that is, the width of TGE denotes a channel length, and W in FIG. 30B, that is, the width of OS1 and OS2 denotes a channel width.

Next, Table 1 shows the calculation conditions.

TABLE 1

| Software | Atlas3D from Silvaco Inc. | | |
|---|---|---|---|
| Structure | L | 30 | nm |
|  | W | 30 | nm |
| BGE | Work function | 5.0 | eV |
|  | Thickness | 20 | nm |
| BGI1 | Relative permittivity | 16.4 |  |
|  | Thickness | 20 | nm |
| BGI2 | Relative permittivity | 4.1 |  |
|  | Thickness | 30 | nm |

TABLE 1-continued

| Software | Atlas3D from Silvaco Inc. | | |
|---|---|---|---|
| TGI | Relative permittivity | 4.1 | |
| | Thickness | 6 | nm |
| TGE | Work function | 4.7 | eV |
| | Thickness | 50 | nm |
| SD | Work function | 4.5 | eV |
| | Thickness | 20 | nm |
| OS1 | Electron affinity | 4.5 | eV |
| IGZO(134) | Eg | 3.4 | eV |
| | Relative permittivity | 15 | |
| | Electron mobility | 1.5 | $cm^2/Vs$ |
| | Hole mobility | 0.01 | $cm^2/Vs$ |
| | Nc | 5E+18 | $/cm^3$ |
| | Nv | 5E+18 | $/cm^3$ |
| | Thickness | 5 | nm |
| OS2 | Electron affinity | 4.6 | eV |
| IGZO(423) | Eg | 3.0 | eV |
| | Relative permittivity | 15 | |
| | Electron mobility | 8 | $cm^2/Vs$ |
| | Hole mobility | 0.01 | $cm^2/Vs$ |
| | Nc | 5E+18 | $/cm^3$ |
| | Nv | 5E+18 | $/cm^3$ |
| | Thickness | 15 | nm |
| | Nd in n + region | 1E+20 | $/cm^3$ |

Figure 31:
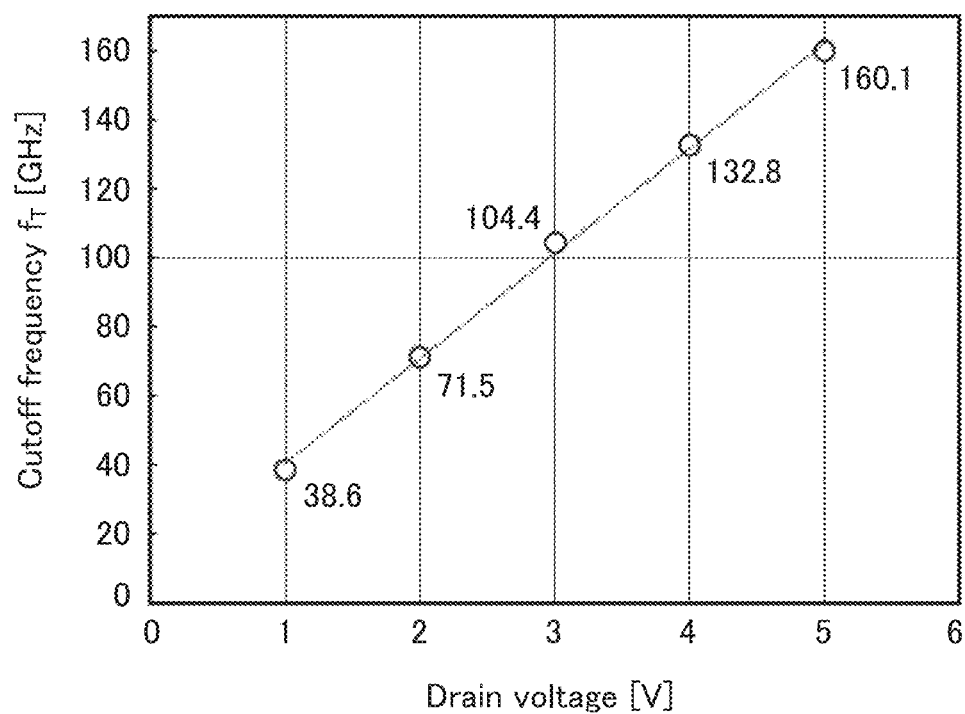
FIG. 31 is a graph showing the calculation results of the cutoff frequency of an OS-FET.

FIG. 31 shows the calculation results of the cutoff frequency of the OS-FET obtained with the above-described conditions. In FIG. 31, the horizontal axis represents the drain voltage (unit: V) of the OS-FET, and the vertical axis represents the cutoff frequency (unit: GHz). In the calculation, the gate voltage and the drain voltage have the same value.

From the results in FIG. 31, the cutoff frequency of the OS-FET was 38.6 GHz when the drain voltage was 1 V; the cutoff frequency was 71.5 GHz when the drain voltage was 2 V; the cutoff frequency was 104.4 GHz when the drain voltage was 3 V; the cutoff frequency was 132.8 GHz when the drain voltage was 4 V; and the cutoff frequency was 160.1 GHz when the drain voltage was 5 V. The calculation confirms that when the drain voltage is set higher than or equal to 3 V, a cutoff frequency of higher than or equal to 100 GHz can be obtained.

According to the above calculation results, the OS-FET can be favorably used as the transistor of one embodiment of the present invention.

The composition, structure, method, and the like described in this example can be used in combination as appropriate with the compositions, structures, methods, and the like described in the other embodiments, the example, and the like.

REFERENCE NUMERALS

100: semiconductor device, 101: transistor, 102: transistor, 103: functional element, 104: node, 105: coil, 106: capacitor, 107: coil, 108: coil, 109: parasitic capacitance, 111: memory element, 112: transistor, 113: capacitor, 114: node, 121: terminal, 122: terminal, 123: terminal, 124: terminal, 125: terminal, 131: operational amplifier

The invention claimed is:

1. A semiconductor device comprising a first transistor, a second transistor, a third transistor, a capacitor, and a functional element,
    wherein one of a source and a drain of the first transistor is electrically connected to a first terminal,
    wherein the other of the source and the drain of the first transistor is electrically connected to one of a source and a drain of the second transistor,
    wherein a gate of the first transistor is electrically connected to a second terminal,
    wherein the other of the source and the drain of the second transistor is electrically connected to a third terminal,
    wherein the other of the source and the drain of the second transistor is electrically connected to the functional element,
    wherein one of a source and a drain of the third transistor is electrically connected to a fourth terminal,
    wherein the other of the source and the drain of the third transistor is electrically connected to a gate of the second transistor,
    wherein a gate of the third transistor is electrically connected to a fifth terminal,
    wherein the capacitor is electrically connected to the other of the source and the drain of the third transistor,
    wherein a semiconductor layer of the third transistor comprises an oxide semiconductor,
    wherein the functional element comprises a resistor, a constant current source, or a parallel resonant circuit, and
    wherein at least one of the first transistor to the third transistor is a multi-gate transistor.

2. The semiconductor device according to claim 1,
    wherein the second transistor comprises a back gate, and
    wherein the gate of the first transistor is electrically connected to the back gate.

3. The semiconductor device according to claim 1,
    wherein the oxide semiconductor comprises at least one of In and Zn.

4. The semiconductor device according to claim 1,
    wherein a semiconductor layer of the first transistor comprises an oxide semiconductor.

5. The semiconductor device according to claim 1,
    wherein a semiconductor layer of the second transistor comprises an oxide semiconductor.

6. The semiconductor device according to claim 1, being electrically connected to an antenna.

7. An electronic device comprising:
    the semiconductor device according to claim 1; and
    a speaker, a microphone, or a secondary battery.

8. The semiconductor device according to claim 1, further comprising:
    a first coil electrically connected to the second terminal and the gate of the first transistor.

9. The semiconductor device according to claim 8, further comprising:
    a second coil electrically connected to the first terminal and the one of the source and the drain of the first transistor.

10. The semiconductor device according to claim 1, further comprising:
    an operation amplifier,
    wherein the operation amplifier is electrically connected to the other one of the source and the drain of the third transistor, the capacitor, and the gate of the second transistor.

11. A semiconductor device comprising a first transistor, a second transistor, a third transistor, a capacitor, and a functional element,
    wherein one of a source and a drain of the first transistor is electrically connected to a first terminal,
    wherein the other of the source and the drain of the first transistor is electrically connected to one of a source and a drain of the second transistor,
    wherein a gate of the first transistor is electrically connected to a second terminal, wherein the other of the source and the drain of the second transistor is electrically connected to a third terminal,
wherein the other of the source and the drain of the second transistor is electrically connected to the functional element,
wherein one of a source and a drain of the third transistor is electrically connected to a fourth terminal,
wherein the other of the source and the drain of the third transistor is electrically connected to a gate of the second transistor,
wherein a gate of the third transistor is electrically connected to a fifth terminal,
wherein the capacitor is electrically connected to the other of the source and the drain of the third transistor,
wherein a semiconductor layer of the third transistor comprises an oxide semiconductor,
wherein the functional element comprises a resistor, a constant current source, or a parallel resonant circuit,
wherein the second transistor is a multi-gate transistor,
wherein a transconductance of the second transistor is higher than each of transconductances of the first transistor and the third transistor.

12. The semiconductor device according to claim 11,
wherein the second transistor comprises a back gate, and
wherein the gate of the first transistor is electrically connected to the back gate.

13. The semiconductor device according to claim 11,
wherein the oxide semiconductor comprises at least one of In and Zn.

14. The semiconductor device according to claim 11,
wherein a semiconductor layer of the first transistor comprises an oxide semiconductor.

15. The semiconductor device according to claim 11,
wherein a semiconductor layer of the second transistor comprises an oxide semiconductor.

16. The semiconductor device according to claim 11, being electrically connected to an antenna.

17. An electronic device comprising:
the semiconductor device according to claim 11; and
a speaker, a microphone, or a secondary battery.

18. The semiconductor device according to claim 11, further comprising:
a first coil electrically connected to the second terminal and the gate of the first transistor.

19. The semiconductor device according to claim 18, further comprising:
a second coil electrically connected to the first terminal and the one of the source and the drain of the first transistor.

20. The semiconductor device according to claim 11, further comprising:
an operation amplifier,
wherein the operation amplifier is electrically connected to the other one of the source and the drain of the third transistor, the capacitor, and the gate of the second transistor.

* * * * *